(12) United States Patent
Jeon et al.

(10) Patent No.: US 11,502,216 B2
(45) Date of Patent: Nov. 15, 2022

(54) METHOD OF MANUFACTURING PHOTO SENSOR

(71) Applicant: SAMSUNG DISPLAY CO., LTD., Yongin-si (KR)

(72) Inventors: Woo-Seok Jeon, Seoul (KR); Kwang Hyun Kim, Hwaseong-si (KR); Heon Sik Ha, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 91 days.

(21) Appl. No.: 16/887,290

(22) Filed: May 29, 2020

(65) Prior Publication Data

US 2021/0135039 A1     May 6, 2021

(30) Foreign Application Priority Data

Nov. 1, 2019  (KR) .................. 10-2019-0138503

(51) Int. Cl.
*H01L 31/18* (2006.01)
*H01L 27/146* (2006.01)
*H01L 31/0224* (2006.01)
*H01L 31/105* (2006.01)

(52) U.S. Cl.
CPC ........ *H01L 31/18* (2013.01); *H01L 27/14692* (2013.01); *H01L 31/022408* (2013.01); *H01L 31/105* (2013.01)

(58) Field of Classification Search
None
See application file for complete search history.

(56) References Cited

U.S. PATENT DOCUMENTS

| | | | | |
|---|---|---|---|---|
| 5,677,240 A | * | 10/1997 | Murakami | H01L 29/458 257/E29.147 |
| 6,008,065 A | * | 12/1999 | Lee | G02F 1/136286 438/30 |
| 6,669,830 B1 | * | 12/2003 | Inoue | C23C 14/3414 438/618 |
| 7,932,183 B2 | * | 4/2011 | Itoh | H01L 21/0273 216/41 |
| 8,921,726 B2 | * | 12/2014 | Hwang | G06F 3/041 200/600 |
| 9,060,452 B2 | * | 6/2015 | Hwang | C23F 1/02 |

(Continued)

FOREIGN PATENT DOCUMENTS

KR    10-2012-0095543     8/2012

*Primary Examiner* — Evren Seven
(74) *Attorney, Agent, or Firm* — F. Chau & Associates, LLC

(57) ABSTRACT

A method of manufacturing a photo sensor includes forming a first conductive layer on a substrate, the first conductive layer including a metal layer and a transparent conductive oxide layer formed on the metal layer, forming a photoconductive layer on the first conductive layer, forming a second conductive layer on the photoconductive layer, forming a first photoresist pattern on the second conductive layer, etching the second conductive layer using the first photoresist pattern as an etch mask to form a second electrode, deforming the first photoresist pattern to form a second photoresist pattern, and etching the photoconductive layer and the first conductive layer using the second photoresist pattern to form a photoconductive pattern and a first electrode, respectively.

19 Claims, 22 Drawing Sheets

(56) References Cited

U.S. PATENT DOCUMENTS

| | | | |
|---|---|---|---|
| 9,615,450 B2* | 4/2017 | Hwang | .................. H05K 3/061 |
| 2016/0232397 A1 | 8/2016 | Yu et al. | |
| 2020/0200925 A1* | 6/2020 | Jeon | ........................ G01T 1/241 |

* cited by examiner

METHOD OF MANUFACTURING PHOTO SENSOR

CROSS-REFERENCE TO RELATED APPLICATION(S)

This application claims priority under 35 USC § 119 to Korean Patent Application No. 10-2019-0138503 filed on Nov. 1, 2019 in the Korean Intellectual Property Office (KIPO), the entire disclosure of which is incorporated by reference herein in its entirety.

BACKGROUND

1. Field

The present invention relates to a photo sensor. More particularly, the present invention relates to a method of manufacturing a photo sensor used in a display device.

2. Description of the Related Art

A display device may provide visual information to a user. Recently, mobile devices such as a smartphone, a tablet computer, or the like, which include the display device, are widely used. For example, electronic commerce or the like may be carried out through the mobile devices. In the electronic commerce, security matters.

Biometric technologies such as fingerprint recognition technology, iris recognition technology, face recognition technology, or the like are used for user verification, security, or the like. For example, a fingerprint recognition sensor using the fingerprint recognition technology is widely used for the mobile devices such as the smartphone, the tablet computer, or the like. The fingerprint recognition sensor may include a capacitive fingerprint recognition sensor, an optical fingerprint recognition sensor, a ultrasound fingerprint recognition sensor, or the like.

SUMMARY

Exemplary embodiments provide a method of manufacturing a photo sensor for reducing the number of photolithography processes.

According to an exemplary embodiment of the present invention, a method of manufacturing a photo sensor includes forming a first conductive layer on a substrate, the first conductive layer including a metal layer and a transparent conductive oxide layer formed on the metal layer, forming a photoconductive layer on the first conductive layer, forming a second conductive layer on the photoconductive layer, forming a first photoresist pattern on the second conductive layer, etching the second conductive layer using the first photoresist pattern as an etch mask to form a second electrode, deforming the first photoresist pattern to form a second photoresist pattern, and etching the photoconductive layer and the first conductive layer using the second photoresist pattern as an etch mask to form a photoconductive pattern and a first electrode, respectively.

According to an exemplary embodiment of the present invention, a method of manufacturing a photo sensor include forming a first conductive layer on a substrate, forming a first photoresist pattern on the first conductive layer, etching the first conductive layer using the first photoresist pattern to form a first electrode, forming a photoconductive layer on the first electrode, forming a second conductive layer on the photoconductive layer, forming a second photoresist pattern on the second conductive layer, etching the second conductive layer using the second photoresist pattern as an etch mask to form a second electrode, deforming the second photoresist pattern to form a third photoresist pattern, and etching the photoconductive layer using the third photoresist pattern as an etch mask to form a photoconductive pattern.

In the method of manufacturing the photo sensor according to the embodiments, the second conductive layer, the photoconductive layer, and the first conductive layer may be etched using single photolithography, or the second conductive layer and the photoconductive layer may be etched using single photolithography, so that the photolithography for forming the photo diode may be performed once or twice. Accordingly, time and cost for manufacturing the photo sensor may be reduced.

BRIEF DESCRIPTION OF THE DRAWINGS

Illustrative, non-limiting embodiments will be more clearly understood from the following detailed description taken in conjunction with the accompanying drawings.

DETAILED DESCRIPTION OF THE EXEMPLARY EMBODIMENTS

Hereinafter, photo sensors and methods of manufacturing photo sensors in accordance with embodiments will be explained in detail with reference to the accompanying drawings.

Hereinafter, a photo sensor according to an exemplary embodiment of the present invention will be described with reference to FIG. 1.

Figure 1:
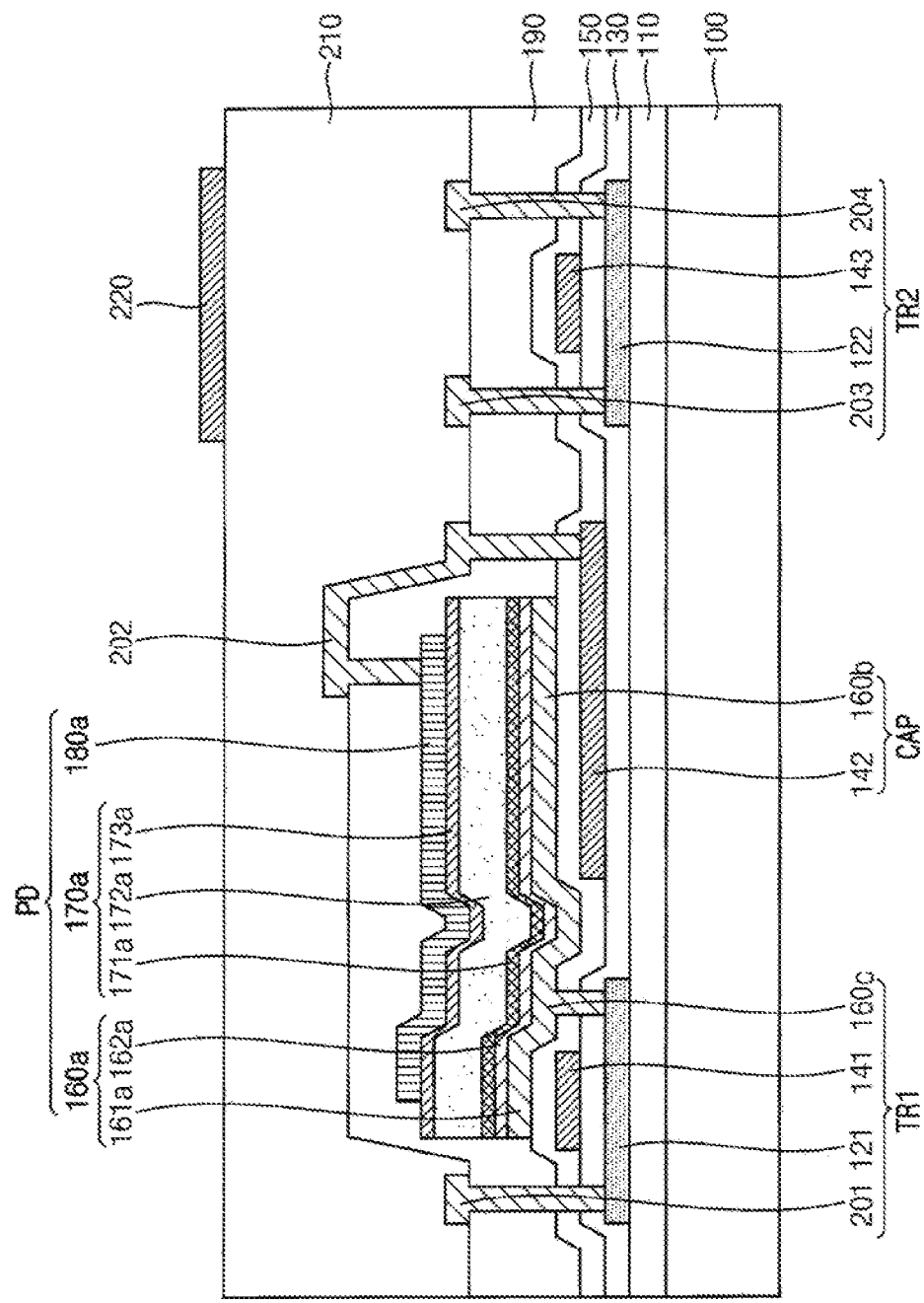
FIG. 1 is a cross-sectional view illustrating a photo sensor according to an exemplary embodiment of the present invention.

FIG. 1 is a cross-sectional view illustrating a photo sensor according to an exemplary embodiment of the present invention.

Referring to FIG. 1, a photo sensor according to an embodiment of the present invention may include a photo diode PD, a capacitor CAP, a first transistor TR1, and a second transistor TR2, which are disposed on a substrate 100. The photo diode PD may include a first electrode 160a, a photoconductive pattern 170a, and a second electrode 180a. The capacitor CAP may include a first capacitor electrode 142 and a second capacitor electrode 160b. The first transistor TR1 may include a first active layer 121, a first gate electrode 141, a first source electrode 160c, and a first drain electrode 201. The second transistor TR2 may include a second active layer 122, a second gate electrode 143, a second source electrode 203, and a second drain electrode 204.

The photo diode PD may receive light incident from thereabove, and may generate a detected signal corresponding to the light. In an exemplary embodiment, the photo diode PD may be a positive-intrinsic-negative (PIN) diode converting light into an electrical signal based on a photoelectric effect. The capacitor CAP may be connected in parallel with the photo diode PD. The first transistor TR1 may transfer, in response to a gate signal, the detected signal transferred from the photo diode PD to a signal processor. The second transistor TR2 may transfer the gate signal to the first transistor TR1.

The photo sensor may be used in a display device or the like. For example, the photo sensor may be disposed under or over the display device, and may be used as a fingerprint recognition sensor for recognizing a user of the display device or the like.

Hereinafter, a method of manufacturing a photo sensor according to an exemplary embodiment of the present invention will be described with reference to FIGS. 1 to 12.

FIGS. 2, 3, 4, 5, 6, 7, 8, 9, 10, 11, and 12 are cross-sectional views illustrating a method of manufacturing the photo sensor in FIG. 1.

Figure 2:
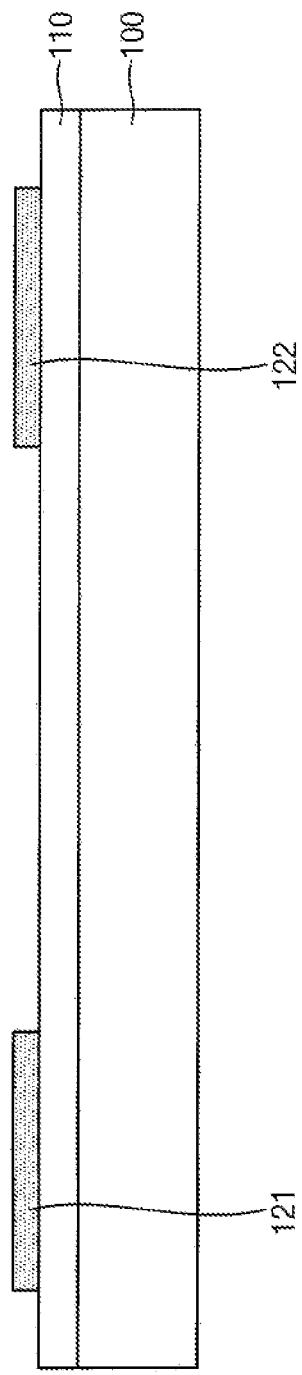
FIGS. 2, 3, 4, 5, 6, 7, 8, 9, 10, 11, and 12 are cross-sectional views illustrating a method of manufacturing the photo sensor in FIG. 1 according to an exemplary embodiment of the present invention.

Referring to FIG. 2, the first active layer 121 and the second active layer 122 may be formed on the substrate 100.

First, a buffer layer 110 may be formed on the substrate 100. For example, an inorganic insulation material such as silicon nitride ($SiN_x$), silicon oxide ($SiO_x$), or the like may be deposited on the substrate 100 to form the buffer layer 110. Then, the first active layer 121 and the second active layer 122 may be formed on the buffer layer 110. For example, amorphous silicon may be deposited on the buffer layer 110 to form an amorphous silicon layer, and the amorphous silicon layer may be crystallized by a heat treatment using, for example, an excimer laser or the like to form a polycrystalline silicon layer. Further, the polycrystalline silicon layer may be etched to form the first active layer 121 and the second active layer 122.

Figure 3:
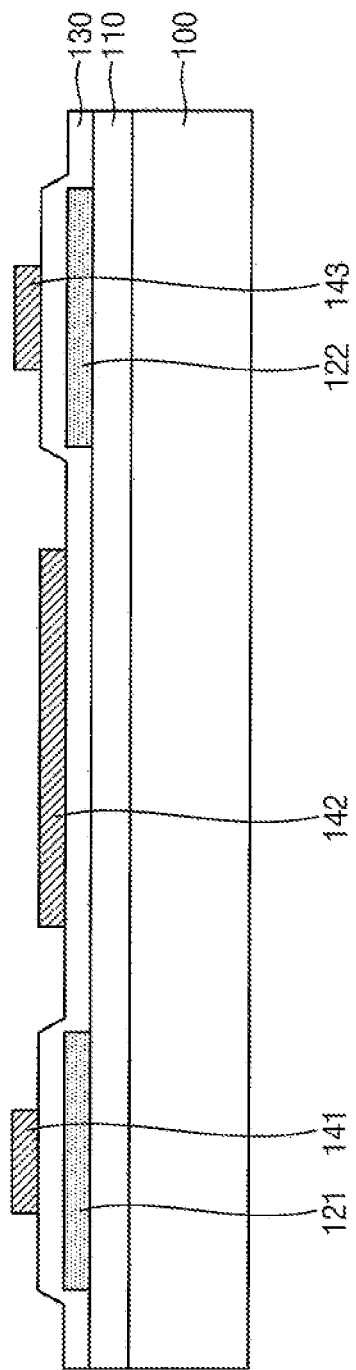

Referring to FIG. 3, the first gate electrode 141, the first capacitor electrode 142, and the second gate electrode 143 may be formed on the substrate 100.

First, a first insulation layer 130 covering the first active layer 121 and the second active layer 122 may be formed on the buffer layer 110. For example, an inorganic insulation material such as silicon oxide ($SiO_x$) or the like may be deposited on the buffer layer 110 to cover the first active layer 121 and the second active layer 122 thereby forming the first insulation layer 130.

Then, the first gate electrode 141, the first capacitor electrode 142, the second gate electrode 143 may be formed on the first insulation layer 130. For example, a conductive material such as molybdenum (Mo), copper (Cu), or the like may be deposited on the first insulation layer 130 to form a conductive layer, and the conductive layer may be etched to form the first gate electrode 141, the first capacitor electrode 142, and the second gate electrode 143. The first gate electrode 141 and the second gate electrode 143 may overlap the first active layer 121 and the second active layer 122, respectively. The first capacitor electrode 142 may be disposed between the first gate electrode 141 and the second gate electrode 143. The first capacitor electrode 142, the first gate electrode 141 and the second gate electrode 143 may be disposed on a same layer of the first insulation layer 130. In an exemplary embodiment, the first capacitor electrode 142 may include an upper surface positioned lower than an upper surface of each of the first gate electrode 141 and the second gate electrode 143.

P-type (positive) or N-type (negative) impurities may be injected into the first active layer 121 and the second active layer 122 using the first gate electrode 141 and the second gate electrode 143 as ion-implantation masks after forming the first gate electrode 141 and the second gate electrode 143. Accordingly, a first source region and a first drain region may be formed at opposite sides of the first active layer 121, and a second source region and a second drain region may be formed at opposite sides of the second active layer 122.

Figure 4:
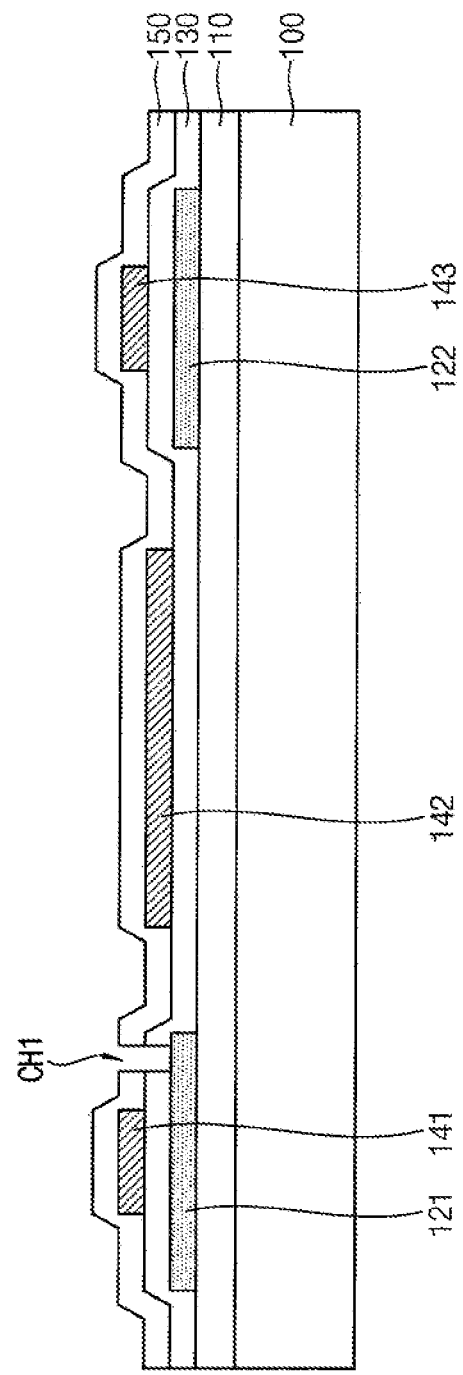

Referring to FIG. 4, a second insulation layer 150 may be formed on the first gate electrode 141, the first capacitor electrode 142, and the second gate electrode 143.

First, the second insulation layer 150 covering the first gate electrode 141, the first capacitor electrode 142, and the second gate electrode 143 may be formed on the first insulation layer 130. For example, an inorganic insulation material such as silicon nitride ($SiN_x$), silicon oxide ($SiO_x$), silicon oxynitride ($SiO_xN_y$), or the like may be deposited on the first insulation layer 130 to cover the first gate electrode 141, the first capacitor electrode 142, and the second gate electrode 143 thereby forming the second insulation layer 150. Then, a first source region contact hole CH1 may be formed in the second insulation layer 150 and the first insulation layer 130. The first source region contact hole CH1 may expose the first source region of the first active layer 121. For example, the first source region contact hole CH1 may penetrate the second insulation layer 150 and the first insulation layer 130 to expose the first source region of the first active layer 121.

Figure 5:
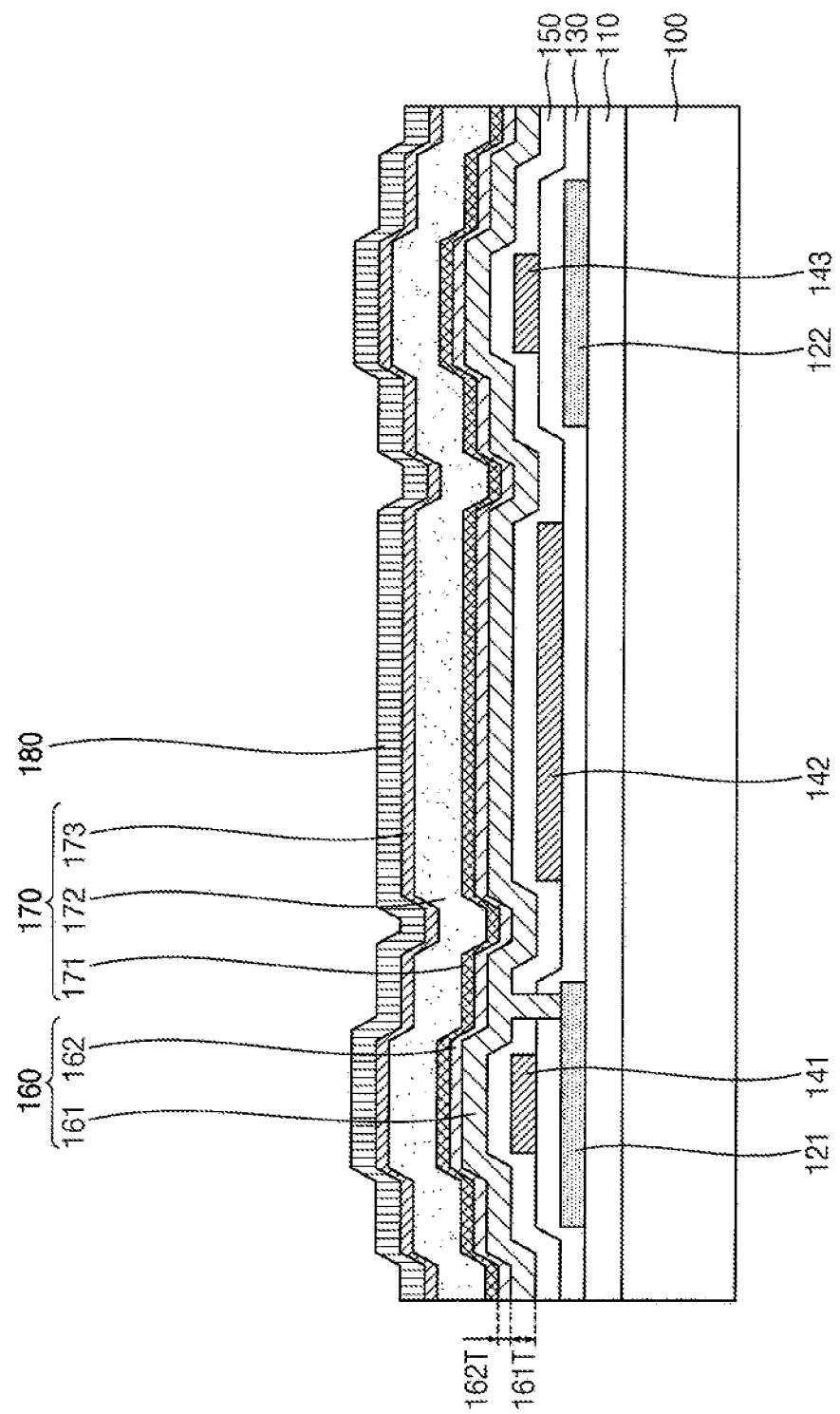

Referring to FIG. 5, a first conductive layer 160, a photoconductive layer 170, a second conductive layer 180 may be formed on the second insulation layer 150.

First, the first conductive layer 160 filling the first source region contact hole CH1 may be formed on the second insulation layer 150. The first conductive layer 160 may include a metal layer 161 and a transparent conductive oxide layer 162 formed on the metal layer 161. For example, the metal layer 161 may include a first portion filling the first source region contact hole CH1 and a second portion disposed between the transparent conductive oxide layer 162 and the second insulation layer 150. In an exemplary embodiment, a conductive material such as molybdenum (Mo), copper (Cu), or the like may be deposited to fill the first source region contact hole CH1 thereby forming the metal layer 161, and a transparent conductive oxide such as indium tin oxide (ITO), indium zinc oxide (IZO), or the like may be deposited on the metal layer 161 to form the transparent conductive oxide layer 162. The first conductive layer 160 may contact the first source region of the first active layer 121 through the first source region contact hole CH1.

In an exemplary embodiment, resistivity of the transparent conductive oxide layer 162 may be greater than resistivity of the metal layer 161. For example, the resistivity of the metal layer 161 may be less than the resistivity of the transparent conductive oxide layer 162. Further, the transparent conductive oxide layer 162 may be formed by a sputtering process. Unlike a sputtering process, electric arc or arc discharge may occur when the photoconductive layer 170 may be formed using a chemical vapor deposition (CVD) process on the metal layer 161 having a relatively low resistivity. In an exemplary embodiment, the CVD process may include a plasma enhanced CVD (PECVD) process. Therefore, the photo sensor and/or a deposition equipment may be damaged. To prevent the electric arc or the arc discharge, a sputtering process may be used to form the transparent conductive oxide layer 162 having a relatively high resistivity on the metal layer 161 having a relatively low resistivity.

In an exemplary embodiment, a thickness 162T of the transparent conductive oxide layer 162 may be less than a thickness 161T of the metal layer 161. Because the resistivity of the transparent conductive oxide layer 162 is relatively high, the thickness 162T of the transparent conductive oxide layer 162 may be small to prevent an amount of resistance of the first conductive layer 160 from increasing.

Then, the photoconductive layer 170 may be formed on the first conductive layer 160. The photoconductive layer 170 may include an N-type (negative) semiconductor layer 171, an I-type (intrinsic) semiconductor layer 172 formed on the N-type semiconductor layer 171, and a P-type (positive) semiconductor layer 173 formed on the I-type semiconductor layer 172.

In an exemplary embodiment, the photoconductive layer 170 may be formed using a chemical vapor deposition (CVD) process. The photoconductive layer 170 may be formed on the transparent conductive oxide layer 162 having a relatively high resistivity, so that electric arc or arc discharge may be prevented from occurring in the CVD process. Unlike the formation of the transparent conductive oxide layer 162, the CVD process may be used to form the photoconductive layer 170.

Then, the second conductive layer 180 may be formed on the photoconductive layer 170. In an exemplary embodiment, the second conductive layer 180 may include a transparent conductive oxide. For example, the transparent conductive oxide such as indium tin oxide (ITO), indium zinc oxide (IZO), or the like may be deposited on the photoconductive layer 170 to form the second conductive layer 180.

Figure 6:
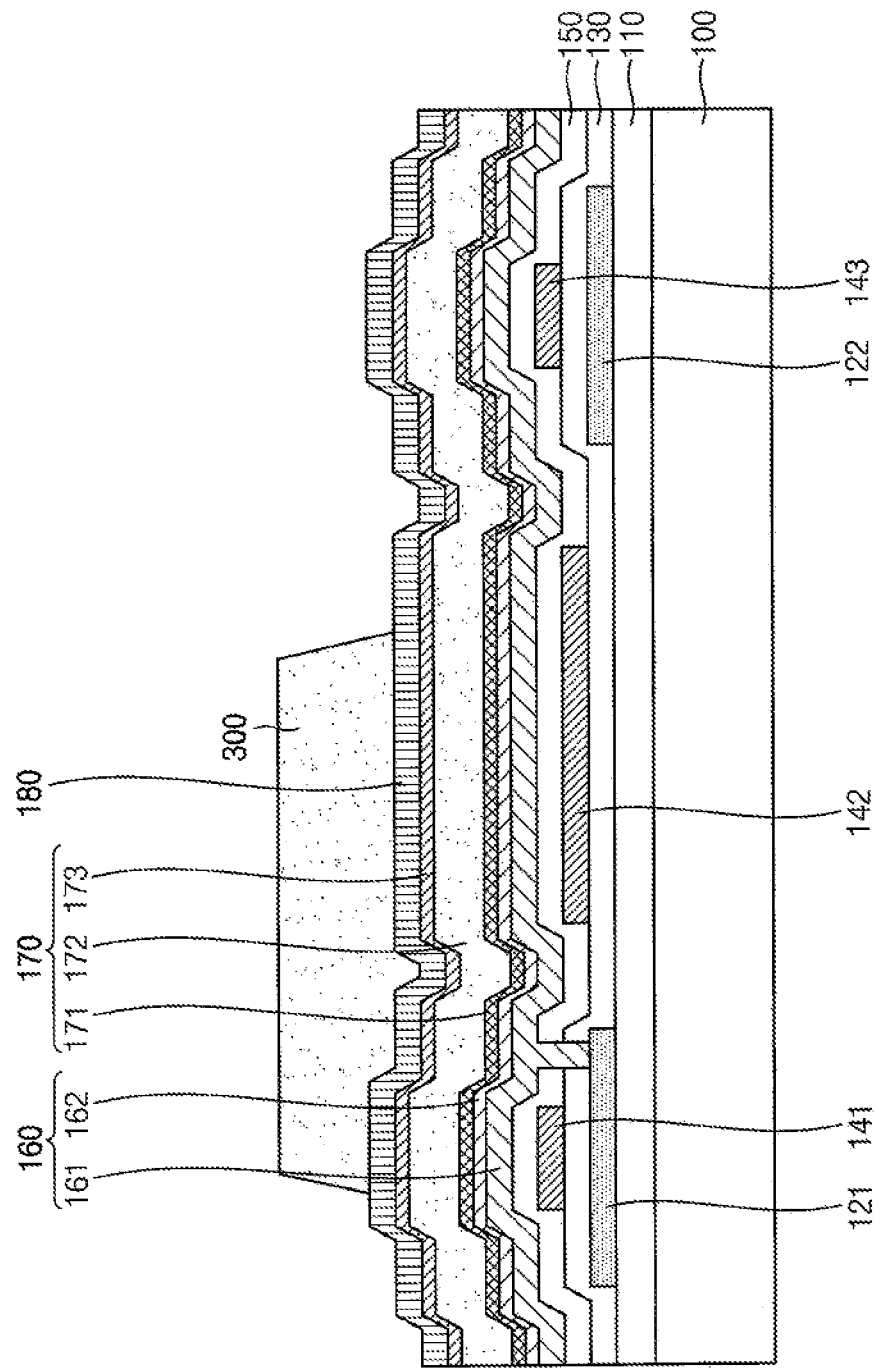

Referring to FIG. 6, a photoresist pattern 300 may be formed on the second conductive layer 180.

For example, photoresist may be coated on the second conductive layer 180 to form a photoresist layer, and the photoresist layer may be exposed and developed in a photolithography process to form the photoresist pattern 300. The photoresist pattern 300 may overlap at least a portion of the first active layer 121 and at least a portion of the first capacitor electrode 142.

Figure 7:
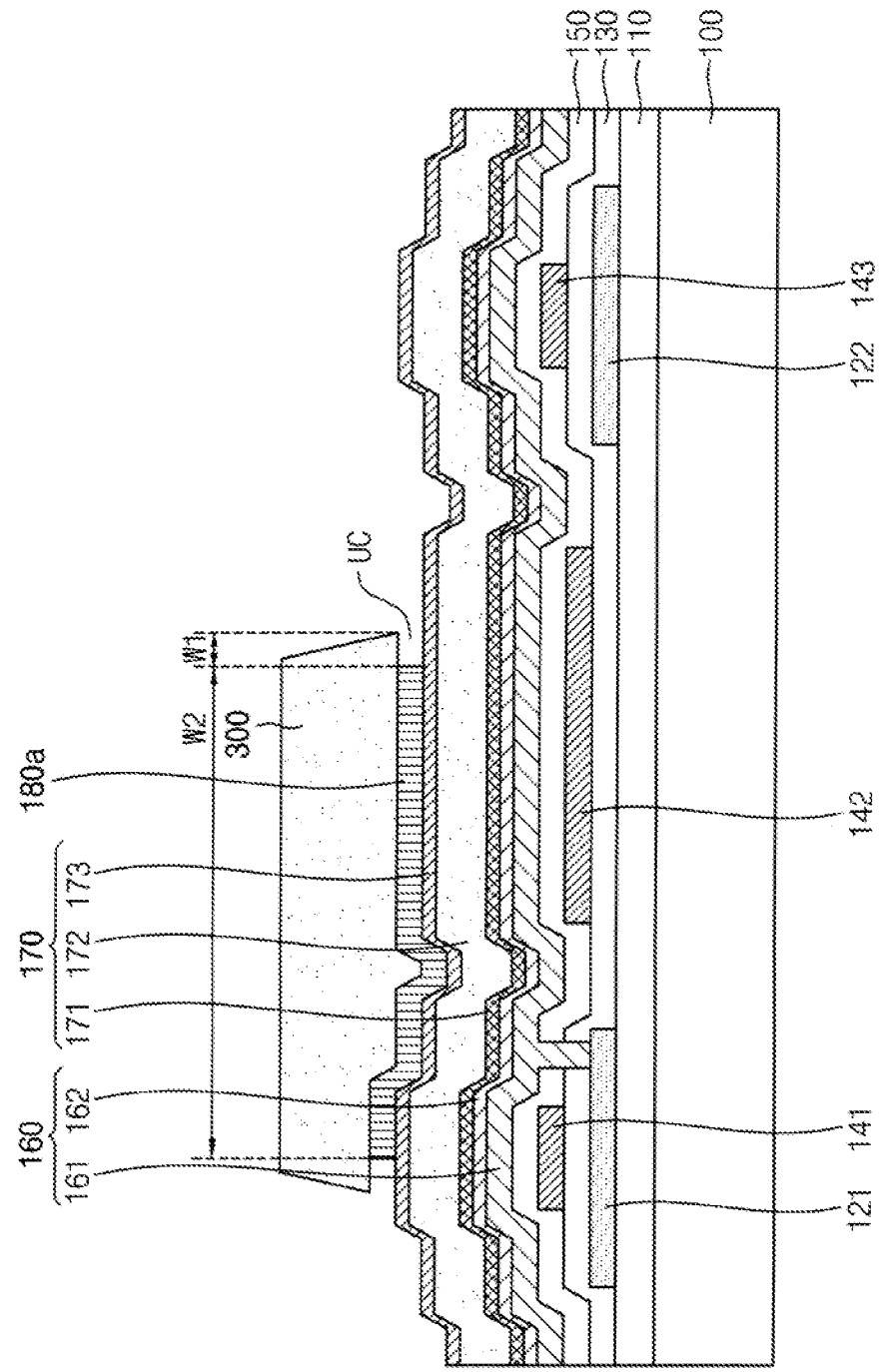

Referring to FIG. 7, the second conductive layer 180 may be etched using the photoresist pattern 300 as an etch mask.

The second conductive layer 180 may be etched using the photoresist pattern 300 as an etch mask to form the second electrode 180a. In an embodiment, the second conductive layer 180 may be etched by using an isotropic etching process such as a wet etching. In an exemplary embodiment, an undercut region UC under the photoresist pattern 300 may be formed in the isotropic etching process such as the wet etching.

The second conductive layer 180 may be etched using the photoresist pattern 300 as an etch mask to form the second electrode 180a. In the etching process, a portion, under the photoresist pattern 300, of the second conductive layer 180 may be etched to form the undercut region UC. In an exemplary embodiment, the undercut region UC may have a predetermined width W1 defined between an edge of the photoresist pattern 300 and a sidewall of the second electrode 180a. For example, a relatively large etch skew may be formed in the process of etching the second conductive layer 180. To form the relatively large etch skew, a time for exposing the second conductive layer 180 to an etchant may increase. The second conductive layer 180 may be etched such that the sidewall of the second electrode 180a may be recessed from the edge of the photoresist pattern 300 by the predetermined width W1. A width W2 of the second electrode 180a may be less than a width of the photoresist pattern 300.

Figure 8:
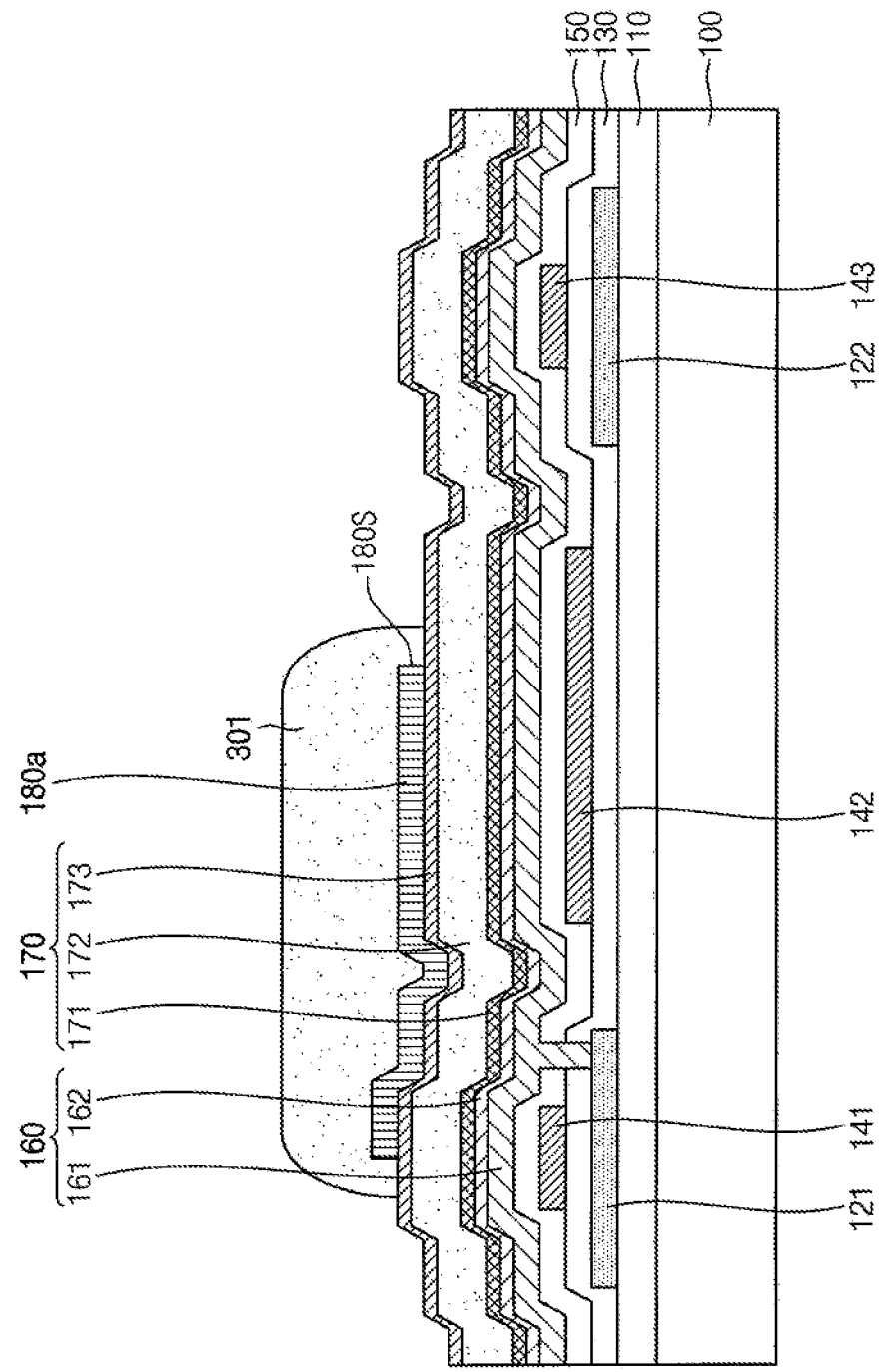

Referring to FIG. 8, in an exemplary embodiment, the photoresist pattern 300 may be reflowed. For example, the photoresist pattern 300 may be reflowed by heat-treatment at a temperature of about 130 degrees or more. In such an embodiment, the reflowed photoresist pattern 301 may cover a side portion 180S of the second electrode 180a, and the undercut region UC may be filled with the reflowed photoresist pattern 301. However, the present invention is not limited thereto. In an exemplary embodiment, the photoresist pattern 300 may not be reflowed.

Figure 9:
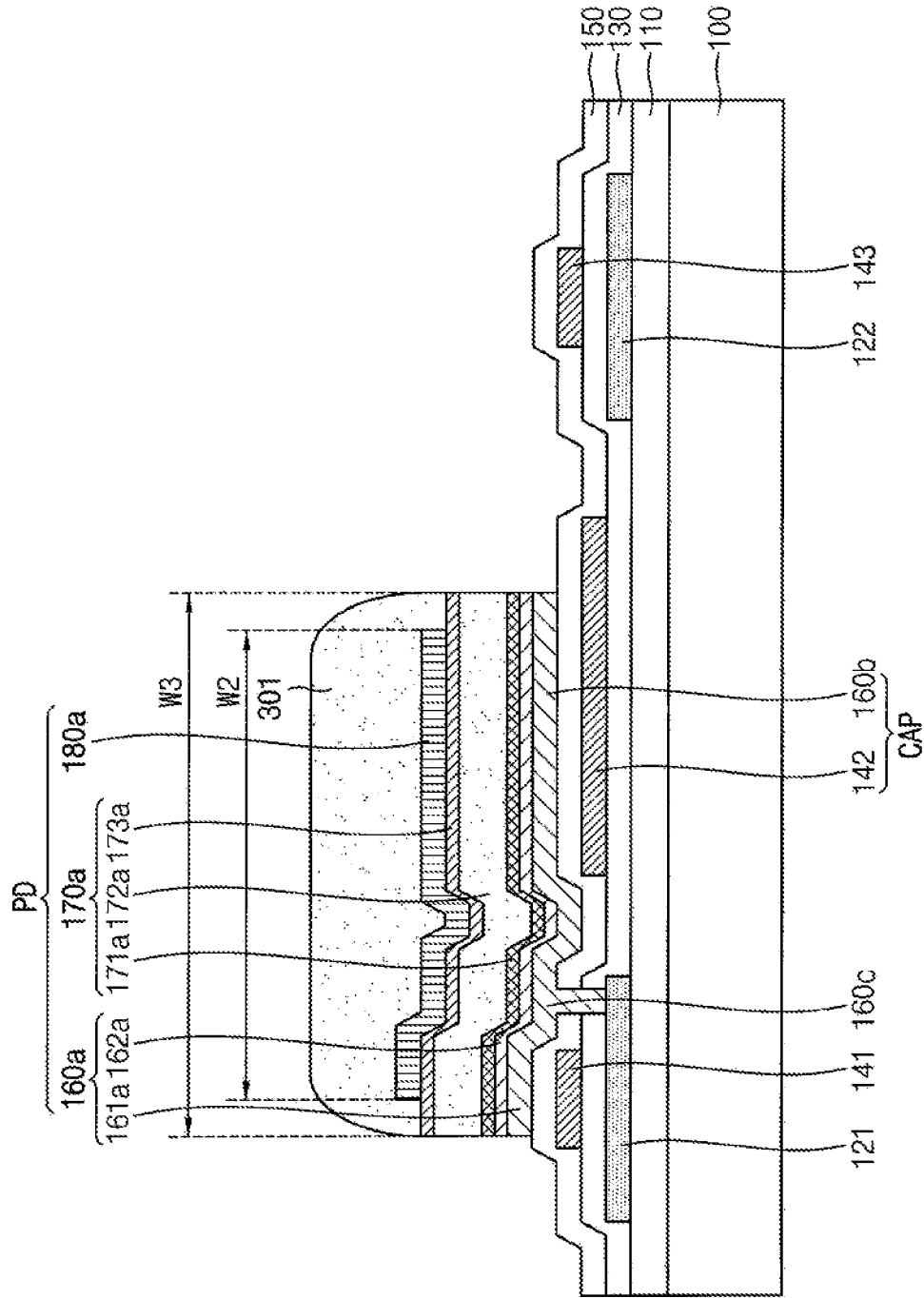

Referring to FIG. 9, the photoconductive layer 170 and the first conductive layer 160 may be etched using the photoresist pattern 301.

The photoconductive layer 170 and the first conductive layer 160 may be etched using the photoresist pattern 301 as an etch mask, so that the photoconductive pattern 170a and the first electrode 160a may be formed. The photoconductive pattern 170a may include an N-type semiconductor pattern 171a, an I-type semiconductor pattern 172a formed on the N-type semiconductor pattern 171a, and a P-type semiconductor pattern 173a formed on the I-type semiconductor pattern 172a. The first electrode 160a may include a metal pattern 161a and a transparent conductive oxide pattern 162a formed on the metal pattern 161a. In an embodiment, the photoconductive layer 170 and the first conductive layer 160 may be etched by an anisotropic etching process using a dry etching.

Each of the photoconductive layer 170 and the first conductive layer 160 may be etched to an edge of the photoresist pattern 301. For example, the shape, in a top down view, of the photoresist pattern 301 may be transferred to each of the photoconductive layer 170 and the first conductive layer 160 to form the photoconductive pattern 170a and the first electrode 160a stacked on each other. Because each of the photoconductive layer 170 and the first conductive layer 160 is etched to the edge of the photoresist pattern 301, a width W3 of the photoconductive pattern 170a and a width W3 of the first electrode 160a may be greater than the width W2 of the second electrode 180a.

The first electrode 160a, the photoconductive pattern 170a, the second electrode 180a may form the photo diode PD. The first capacitor electrode 142 and the second capacitor electrode 160b may form the capacitor CAP. In this case, the second capacitor electrode 160b and the first electrode 160a may be integrally formed. For example, the metal layer 161 may be patterned to form the metal pattern 161a of the first electrode 160a and the second capacitor electrode 160b. A portion of the patterned metal layer may serve as the metal pattern 161a, and another portion of the patterned metal layer may serve as the second capacitor electrode 160b.

Figure 10:
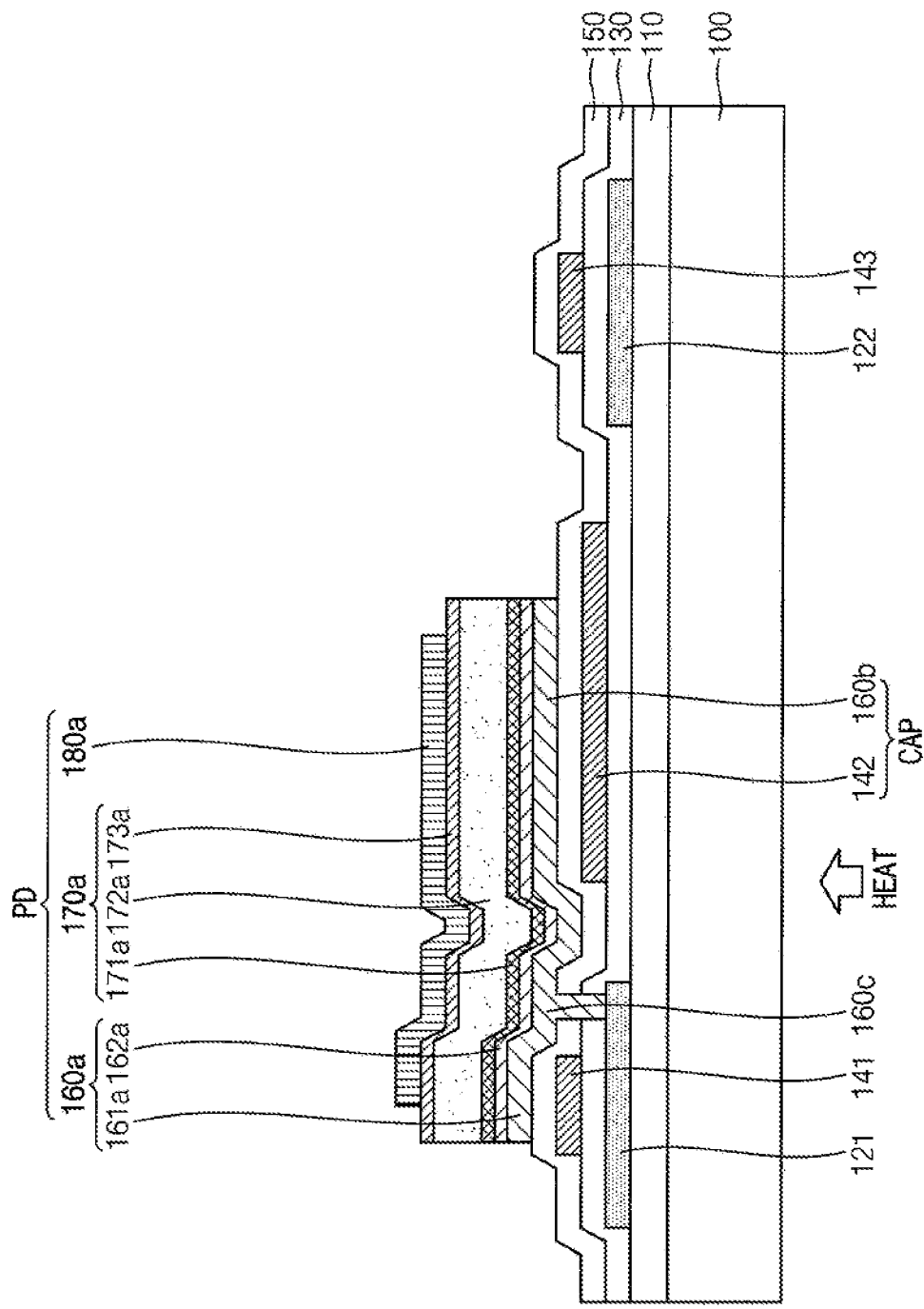

Referring to FIG. 10, in an embodiment, the first electrode 160a may be heat-treated.

First, the photoresist pattern 301 may be stripped. Then, heat may be supplied to the first electrode 160a to heat-treat the first electrode 160a. For example, heat may be supplied to the first electrode 160a using an oven or the like. As described above, the transparent conductive oxide pattern 162a formed by etching the transparent conductive oxide layer 162 may have the relatively high resistivity, and the first electrode 160a may be heat-treated to decrease the resistivity of the transparent conductive oxide pattern 162a. Accordingly, the resistivity of the transparent conductive oxide pattern 162a after the heat-treatment may be less than the resistivity of the transparent conductive oxide pattern 162a before the heat-treatment.

In an embodiment, the first electrode 160a may be heat-treated after etching the photoconductive layer 170 and the first conductive layer 160. If the first conductive layer 160 is heat-treated before etching the first conductive layer 160, an excessive amount of residues may be generated when etching the first conductive layer 160.

Figure 11:
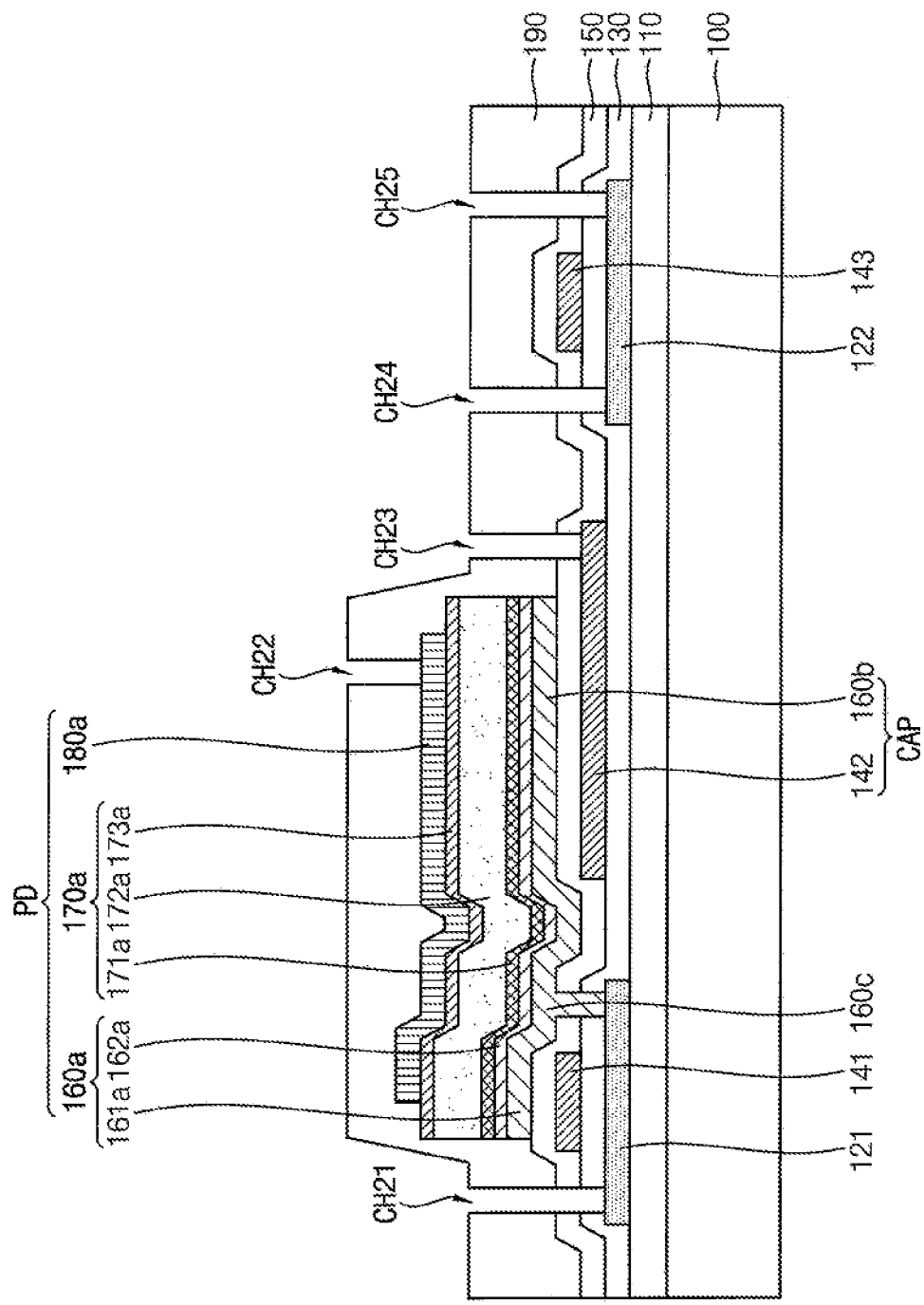

Referring to FIG. 11, a third insulation layer 190 may be formed on the second electrode 180a.

First, the third insulation layer 190 covering the second electrode 180a may be formed on the second insulation layer 150. For example, an inorganic insulation material such as silicon nitride ($SiN_x$), silicon oxide ($SiO_x$), silicon oxynitride ($SiO_xN_y$), or the like may be deposited on the second insulation layer 150 to cover the second electrode 180a thereby forming the third insulation layer 190.

Then, a first drain region contact hole CH21, a second electrode contact hole CH22, a first capacitor electrode contact hole CH23, a second source region contact hole CH24, and a second drain region contact hole CH25 may be formed in the third insulation layer 190. The first drain region contact hole CH21, the second electrode contact hole CH22, the first capacitor electrode contact hole CH23, the second source region contact hole CH24, and the second drain region contact hole CH25 may expose the first drain region of the first active layer 121, the second electrode 180a, the first capacitor electrode 142, the second source region of the second active layer 122, and the second drain region of the second active layer 122, respectively.

Figure 12:
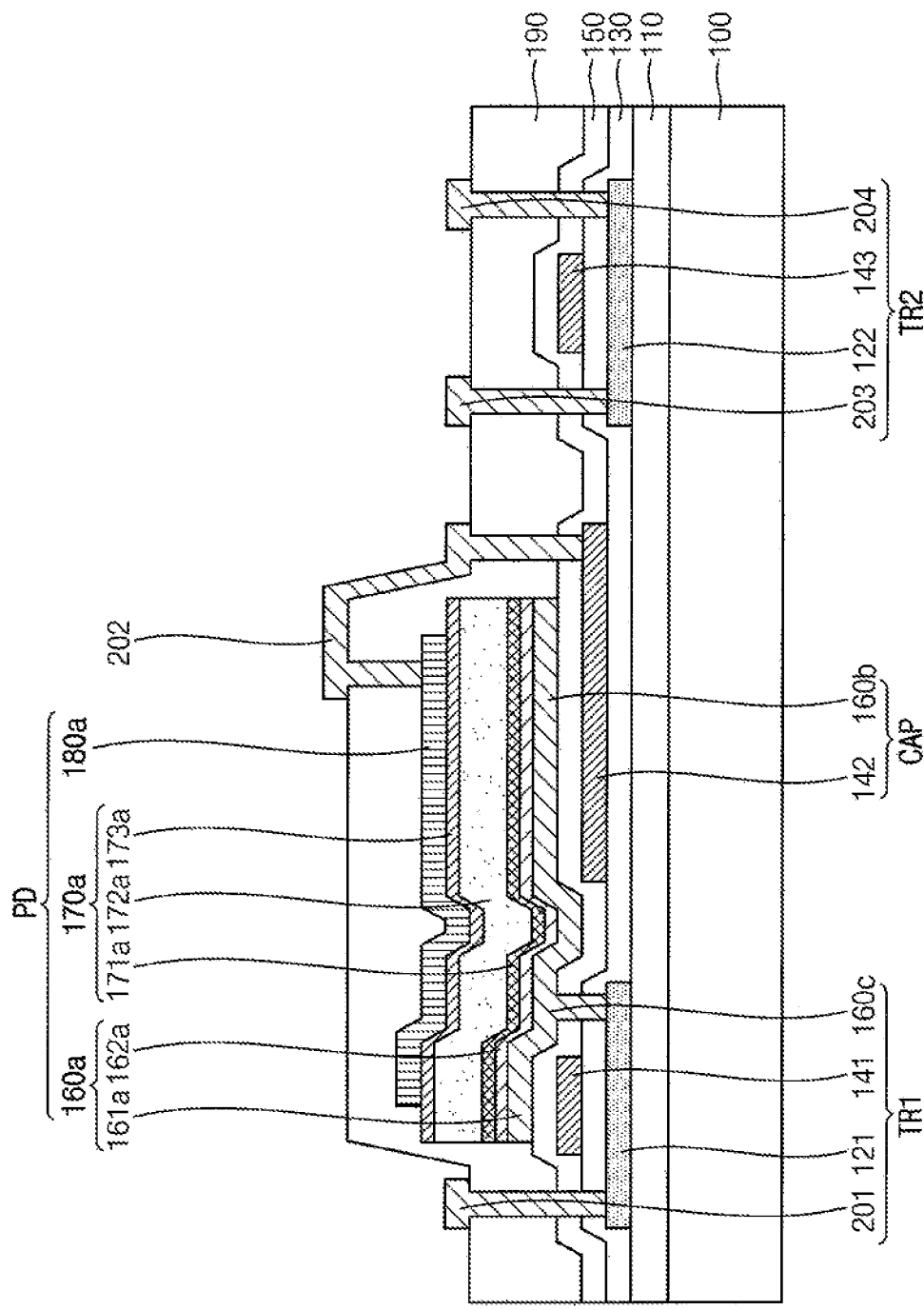

Referring to FIG. 12, the first drain electrode 201, a connection electrode 202, the second source electrode 203, and the second drain electrode 204 may be formed on the third insulation layer 190. For example, a conductive material such as aluminum (Al), titanium (Ti), copper (Cu), or the like may be deposited to fill the first drain region contact hole CH21, the second electrode contact hole CH22, the first capacitor electrode contact hole CH23, the second source region contact hole CH24, and the second drain region contact hole CH25 thereby forming a conductive layer, and the conductive layer may be etched to form the first drain electrode 201, the connection electrode 202, the second source electrode 203, and the second drain electrode 204. The first drain electrode 201 may contact the drain region of the first active layer 121 through the first drain region contact hole CH21, and the connection electrode 202 may contact the second electrode 180a and the first capacitor electrode 142 through the second electrode contact hole CH22 and the first capacitor electrode contact hole CH23, respectively. The second source electrode 203 may contact the second source region of the second active layer 122 through the second source region contact hole CH24, and the second drain electrode 204 may contact the second drain region of the second active layer 122 through the second drain region contact hole CH25.

The first active layer 121, the first gate electrode 141, the first source electrode 160c, and the first drain electrode 201 may form the first transistor TR1. The first source electrode 160c and the first electrode 160a may be integrally formed. For example, the metal layer 161 of FIG. 5 may be patterned such that a portion of the patterned metal layer may serve as the metal pattern 161a, and another portion of the patterned metal layer filling the first source region contact hole CH1 may serve as the first source electrode 160c. The second active layer 122, the second gate electrode 143, the second source electrode 203, and the second drain electrode 204 may form the second transistor TR2. The connection electrode 202 may electrically connect the second electrode 180a of the photo diode PD to the first capacitor electrode 142 of the capacitor CAP.

Referring to FIG. 1, a protective layer 220 may be formed on the first drain electrode 201, the connection electrode 202, the second source electrode 203, and the second drain electrode 204.

First, a fourth insulation layer 210 covering the first drain electrode 201, the connection electrode 202, the second source electrode 203, and the second drain electrode 204 may be formed on the third insulation layer 190. For example, an organic insulation material such as polyimide (PI) or the like may be deposited on the third insulation layer 190 to cover the first drain electrode 201, the connection electrode 202, the second source electrode 203, and the second drain electrode 204, thereby forming the fourth insulation layer 210. The fourth insulation layer 210 may have a planarized upper surface.

Then, a preliminary protective layer may be formed on the fourth insulation layer 210. For example, the preliminary protective layer may include a conductive material such as aluminum (Al), titanium (Ti), copper (Cu), or the like may be deposited on the fourth insulation layer 210, and the preliminary protective layer may be etched to form the protective layer 220. The protective layer 220 may overlap the second transistor TR2.

In the method of manufacturing the photo sensor according to an embodiment of the present invention, the second conductive layer 180, the photoconductive layer 170, and the first conductive layer 160 may be etched by single photolithography, so that the photolithography for forming the photo diode PD may be performed once. Accordingly, time and cost for manufacturing the photo sensor may be reduced.

Hereinafter, a photo sensor according to an embodiment of the present invention will be described with reference to FIG. 13.

Figure 13:
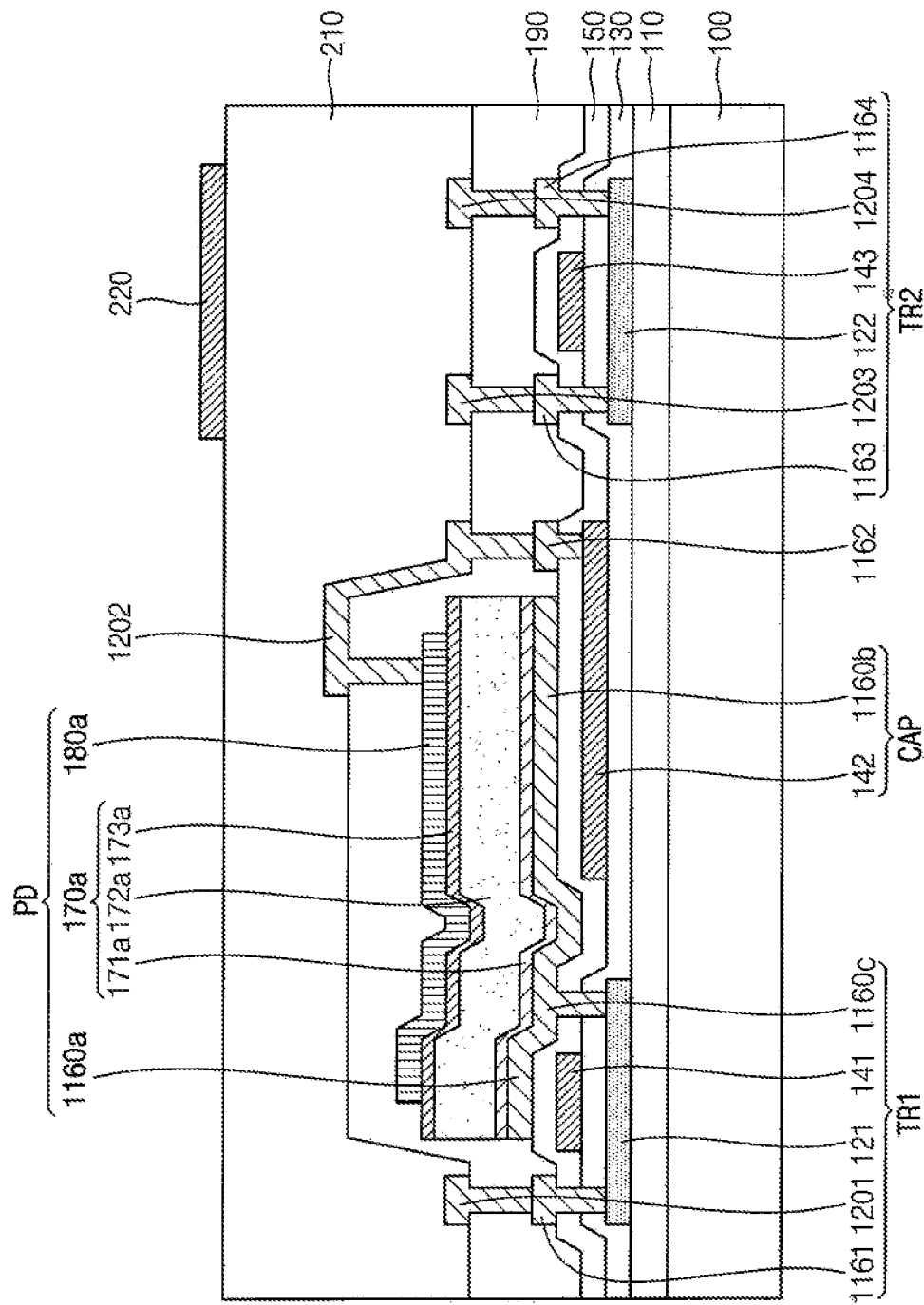
FIG. 13 is a cross-sectional view illustrating a photo sensor according to an exemplary embodiment of the present invention.

FIG. 13 is a cross-sectional view illustrating a photo sensor according to an embodiment of the present invention.

Referring to FIG. 13, a photo sensor according to an embodiment of the present invention may include a photo diode PD, a capacitor CAP, a first transistor TR1, and a second transistor TR2, which are disposed on a substrate 100. The photo diode PD may include a first electrode 1160a, a photoconductive pattern 170a, and a second electrode 180a. The capacitor CAP may include a first capacitor electrode 142 and a second capacitor electrode 1160b. The first transistor TR1 may include a first active layer 121, a first gate electrode 141, a first source electrode 1160c, a first drain connection electrode 1161, and a first drain electrode 1201. The second transistor TR2 may include a second active layer 122, a second gate electrode 143, a second source connection electrode 1163, a second source electrode 1203, a second drain connection electrode 1164, and a second drain electrode 1204.

Hereinafter, a method of manufacturing a photo sensor according to an embodiment of the present invention will be described with reference to FIGS. 13 to 22. Descriptions on elements of a method of manufacturing a photo sensor according to an embodiment of the present invention described with reference to FIGS. 13 to 22, which are substantially the same as or similar to those of the method of manufacturing the photo sensor according to an embodiment of the present invention described with reference to FIGS. 1 to 12, will not be repeated.

FIGS. 14, 15, 16, 17, 18, 19, 20, 21, and 22 are cross-sectional views illustrating a method of manufacturing the photo sensor in FIG. 13.

Figure 14:
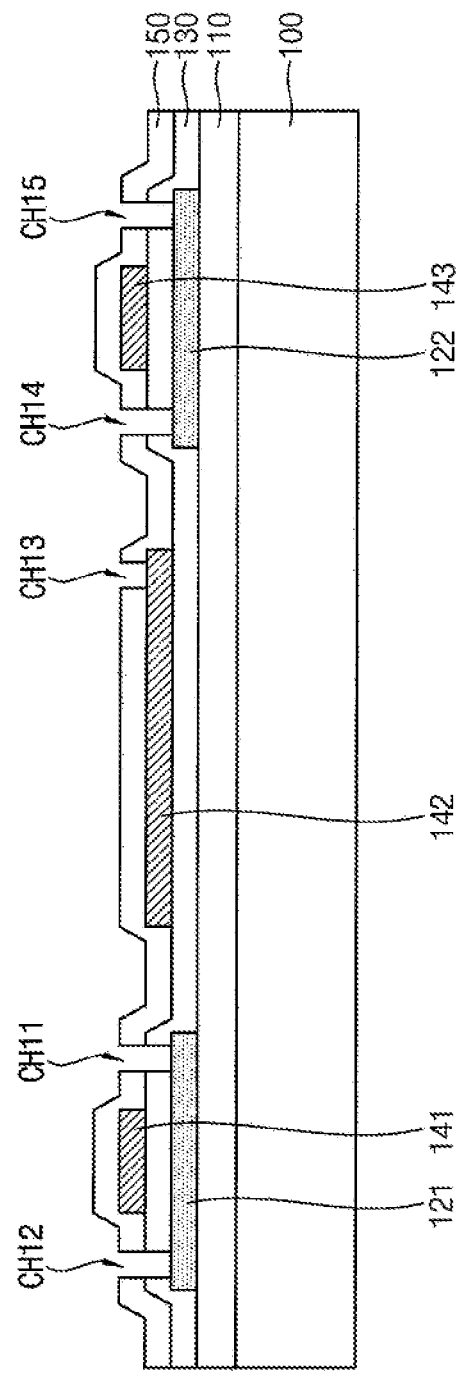
FIGS. 14, 15, 16, 17, 18, 19, 20, 21, and 22 are cross-sectional views illustrating a method of manufacturing the photo sensor in FIG. 13 according to an exemplary embodiment of the present invention.

Referring to FIG. 14, a second insulation layer 150 may be formed on the first gate electrode 141, the first capacitor electrode 142, and the second gate electrode 143.

First, the second insulation layer 150 covering the first gate electrode 141, the first capacitor electrode 142, and the second gate electrode 143 may be formed on the first insulation layer 130. Then, a first source region contact hole CH11, a first drain region contact hole CH12, a first capacitor electrode contact hole CH13, a second source region contact hole CH14, and a second drain region contact hole CH15 may be formed in the second insulation layer 150. The first source region contact hole CH11 and the first drain region contact hole CH12 may expose the first source region and the first drain region of the first active layer 121, respectively. The first capacitor electrode contact hole CH13 may expose the first capacitor electrode 142. The second source region contact hole CH14 and the second drain region contact hole CH15 may expose the second source region and the second drain region of the second active layer 122, respectively.

Figure 15:
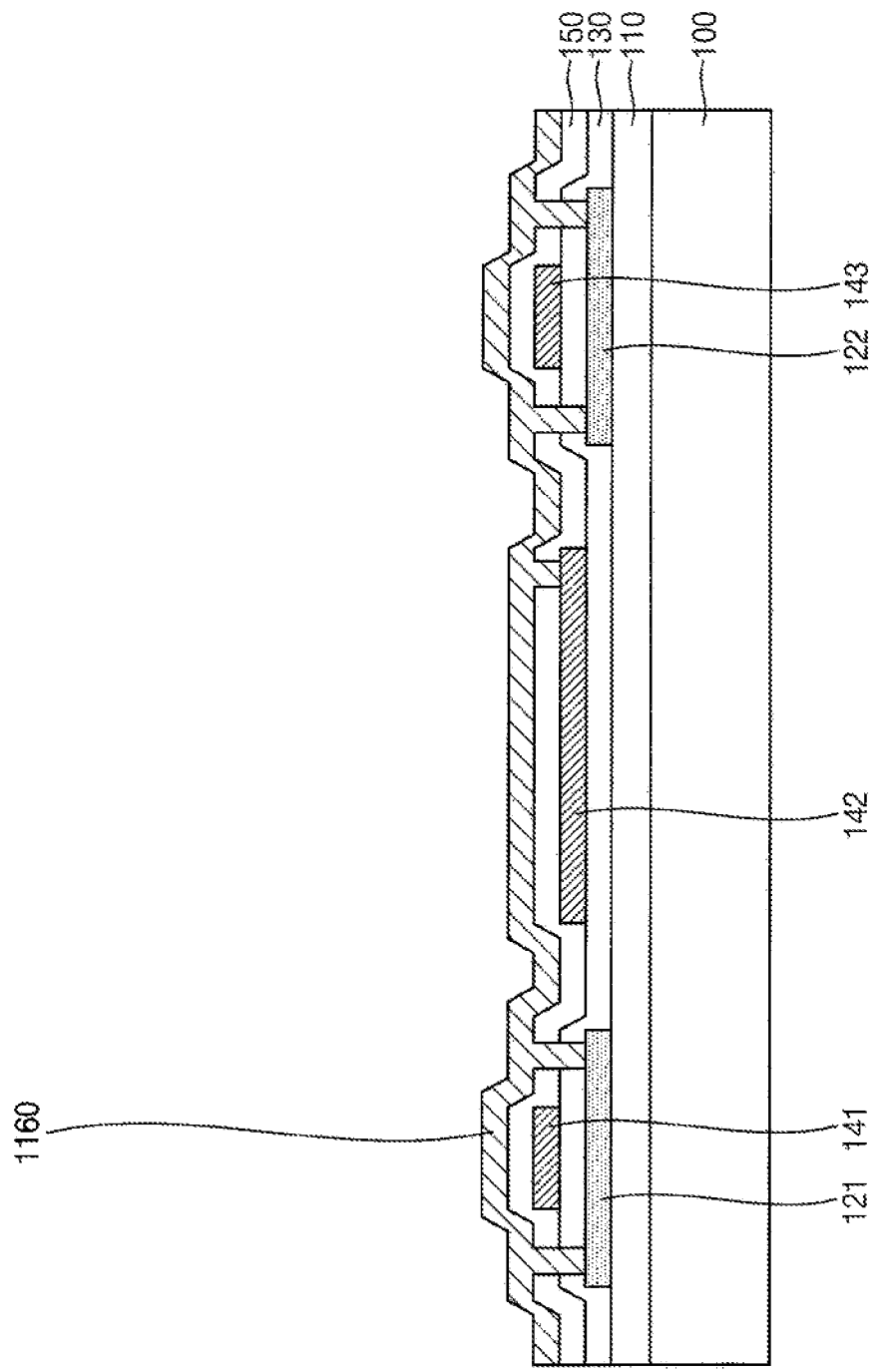

Referring to FIG. 15, a first conductive layer 1160 may be formed on the second insulation layer 150.

The first conductive layer 1160 filling the first source region contact hole CH11, the first drain region contact hole CH12, the first capacitor electrode contact hole CH13, the second source region contact hole CH14, and the second drain region contact hole CH15 may be formed on the second insulation layer 150. The first conductive layer 1160 may include metal. For example, a conductive material such as molybdenum (Mo), copper (Cu), or the like may be deposited to fill the first source region contact hole CH11, the first drain region contact hole CH12, the first capacitor electrode contact hole CH13, the second source region contact hole CH14, and the second drain region contact hole CH15 thereby forming the first conductive layer 1160. The first conductive layer 1160 may contact the first source region and the first drain region of the first active layer 121 through the first source region contact hole CH11 and the first drain region contact hole CH12, respectively. The first conductive layer 1160 may contact the first capacitor electrode 142 through the first capacitor electrode contact hole CH13. The first conductive layer 1160 may contact the second source region and the second drain region of the second active layer 122 through the second source region contact hole CH14 and the second drain region contact hole CH15, respectively.

Figure 16:
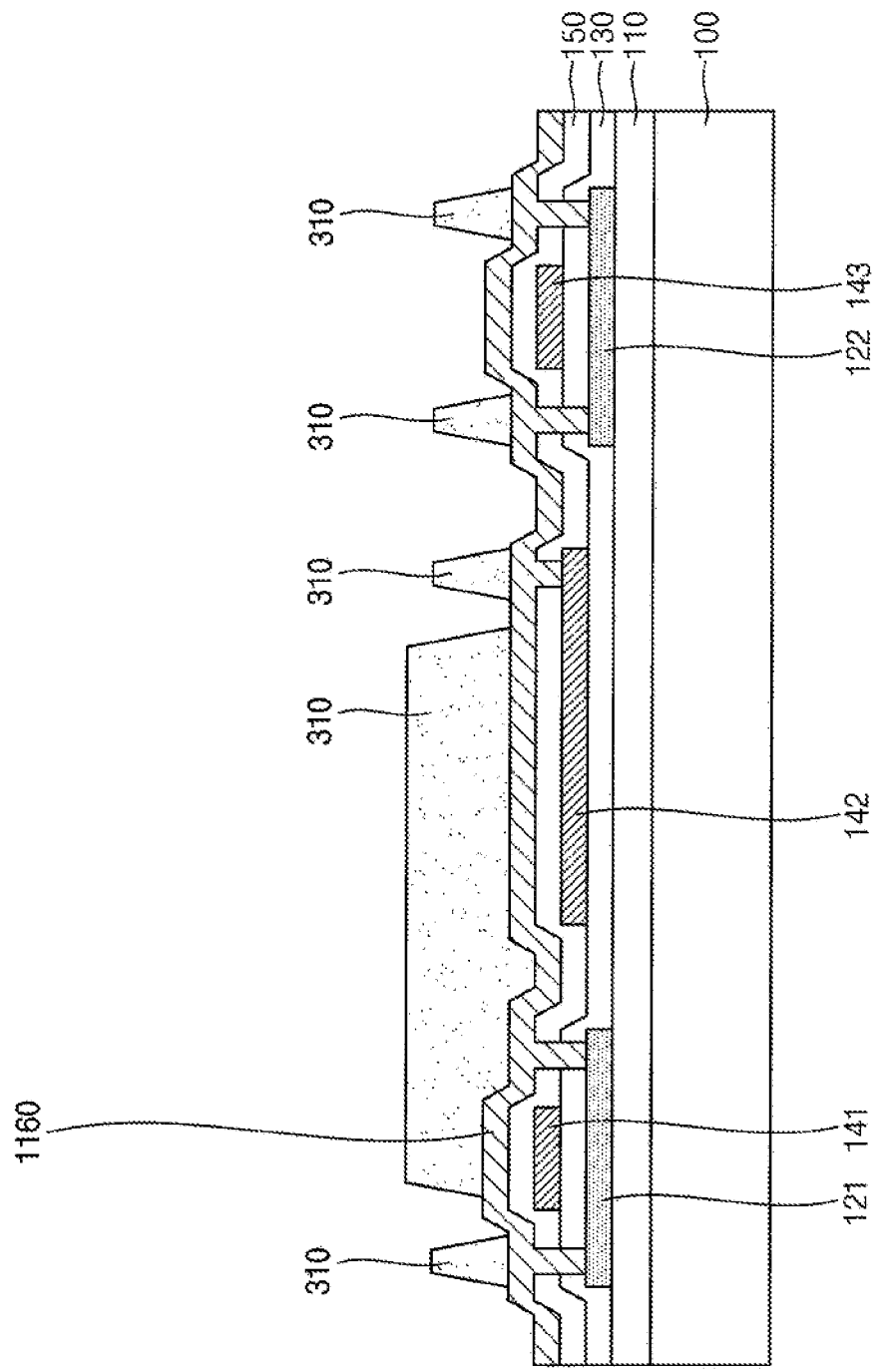

Referring to FIG. 16, a first photoresist pattern 310 may be formed on the first conductive layer 1160.

For example, photoresist may be coated on the first conductive layer 1160 to form a photoresist layer, and the photoresist layer may be exposed and developed using a photolithography process to form the first photoresist pattern 310. The first photoresist pattern 310 may overlap at least a portion of the first active layer 121, at least a portion of the first capacitor electrode 142, the first drain region contact hole CH12, the first capacitor electrode contact hole CH13, the second source region contact hole CH14, and the second drain region contact hole CH15.

Figure 17:
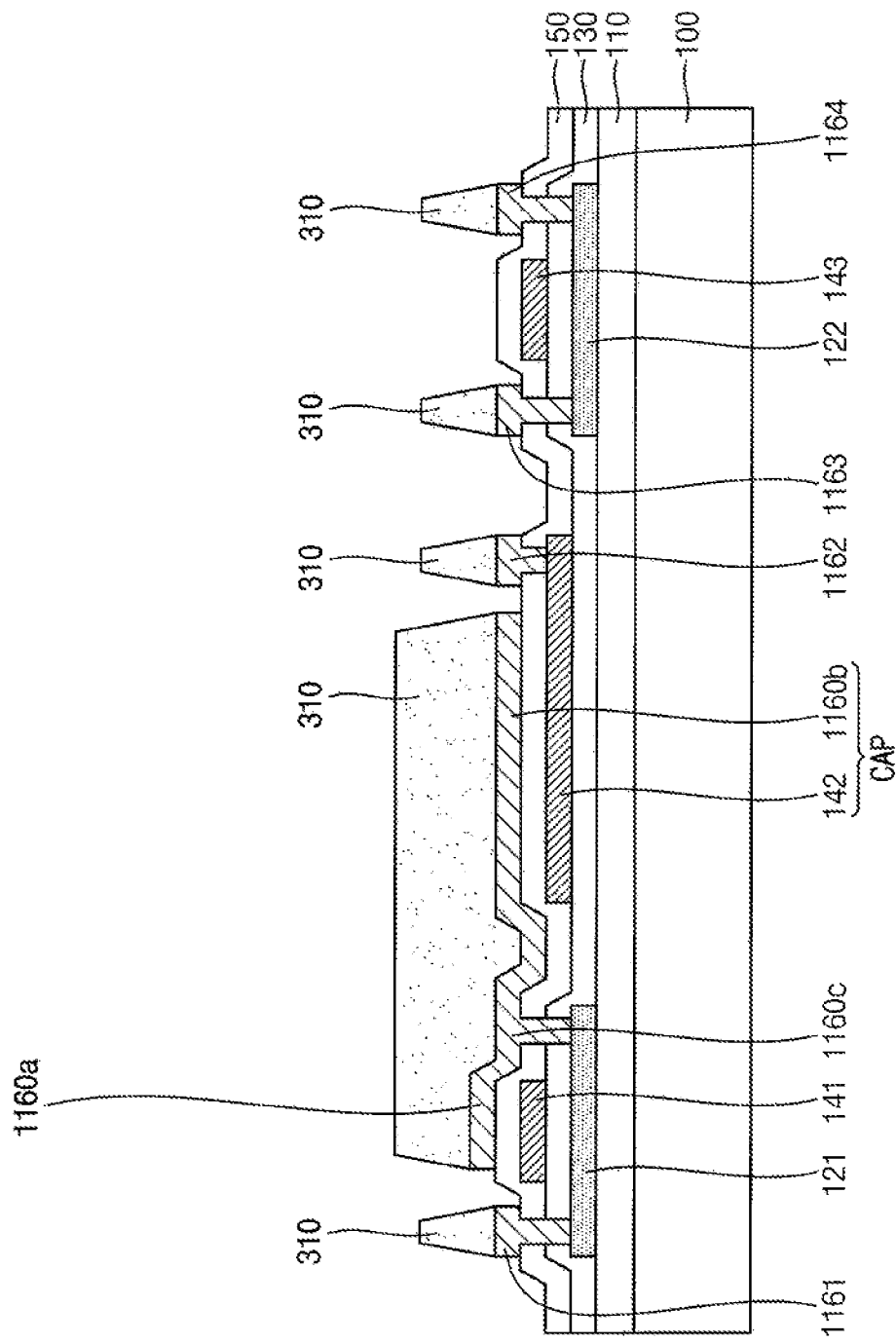

Referring to FIG. 17, the first conductive layer 1160 may be etched using the first photoresist pattern 310.

The first conductive layer 1160 may be etched using the first photoresist pattern 310 as an etch mask to form the first electrode 1160a, the first drain connection electrode 1161, the first connection electrode 1162, the second source connection electrode 1163, and the second drain connection electrode 1164. The first capacitor electrode 142 and the second capacitor electrode 1160b may form the capacitor CAP. In this case, the second capacitor electrode 1160b and the first electrode 1160a may be integrally formed. For example, the first conductive layer 1160 of FIG. 15 may be patterned such that a portion of the patterned first conductive layer may serve as the first electrode 1160a, and another portion of the patterned first conductive layer may serve as the second capacitor electrode 1160b.

Figure 18:
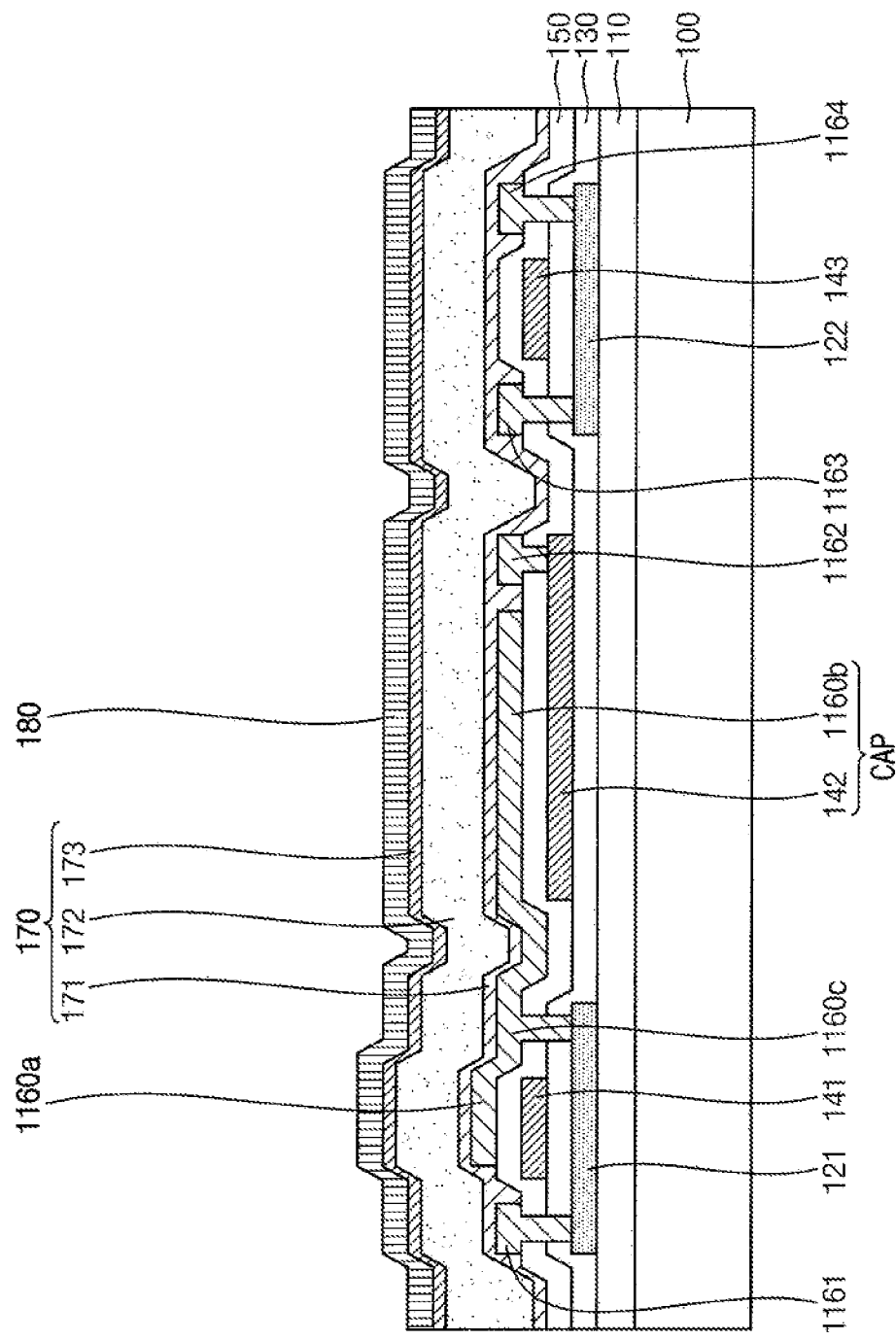

Referring to FIG. 18, a photoconductive layer 170 and the second conductive layer 180 may be sequentially formed on the first electrode 1160a, the first drain connection electrode 1161, the first connection electrode 1162, the second source connection electrode 1163, and the second drain connection electrode 1164.

First, the first photoresist pattern 310 may be stripped. Then, the photoconductive layer 170 covering the first electrode 1160a, the first drain connection electrode 1161, the first connection electrode 1162, the second source connection electrode 1163, and the second drain connection electrode 1164 may be formed on the second insulation layer 150. Then, the second conductive layer 180 may be formed on the photoconductive layer 170.

Figure 19:
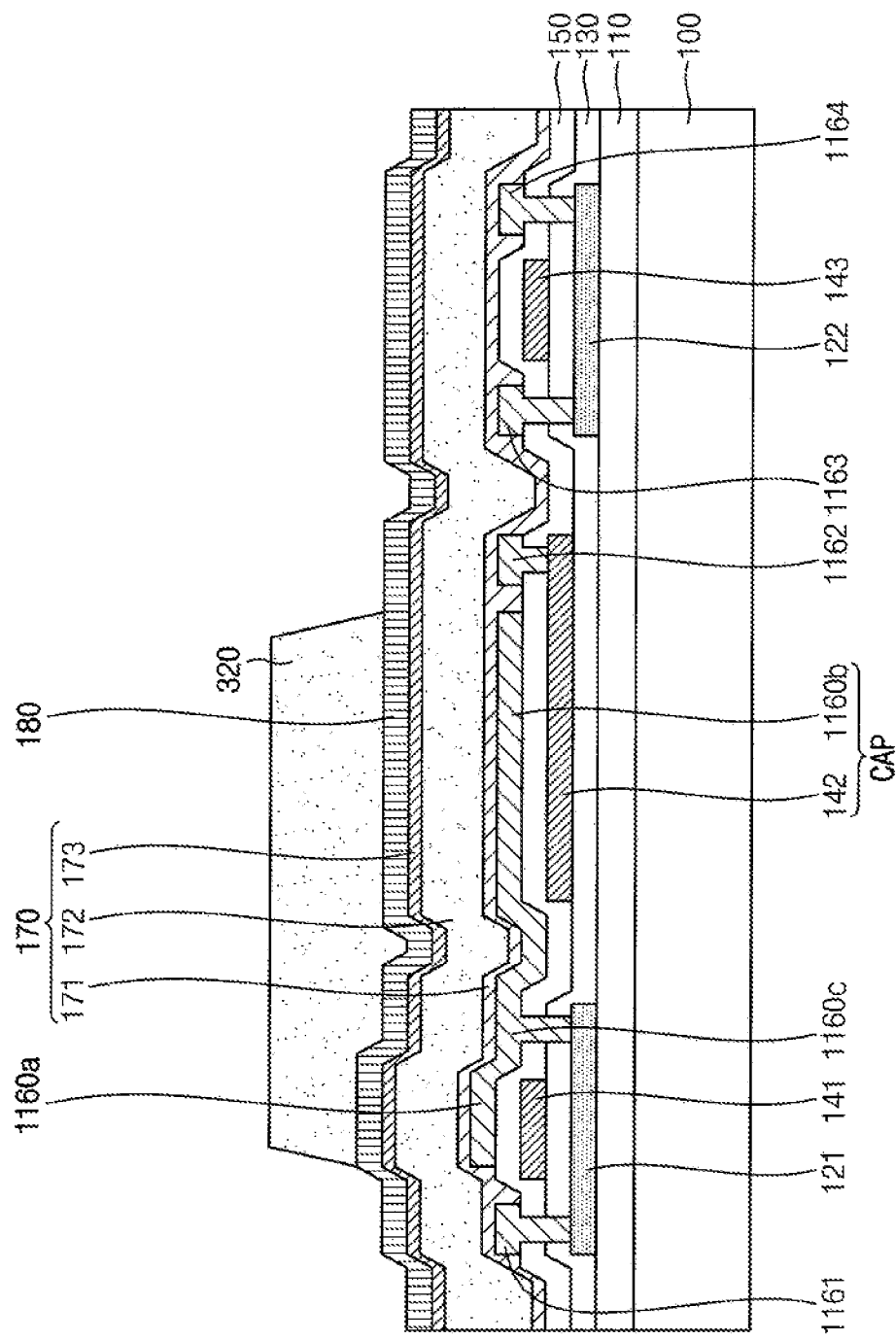

Referring to FIG. 19, a second photoresist pattern 320 may be formed on the second conductive layer 180.

For example, photoresist may be coated on the second conductive layer 180 to form a photoresist layer, and the photoresist layer may be exposed and developed using a photolithography process to form the second photoresist pattern 320. The second photoresist pattern 320 may overlap at least a portion of the first active layer 121 and at least a portion of the first capacitor electrode 142.

Figure 20:
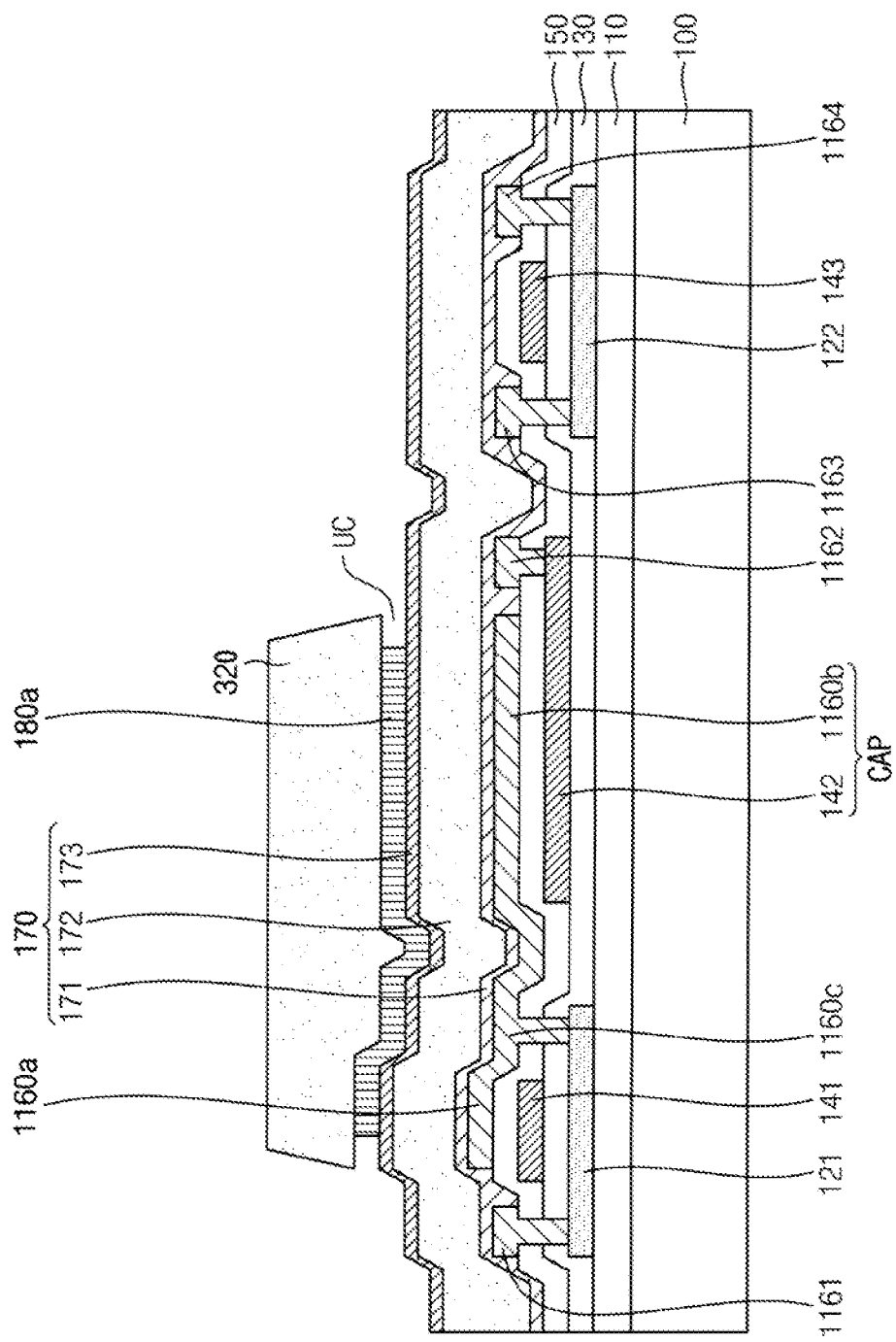

Referring to FIG. 20, the second conductive layer 180 may be etched using the second photoresist pattern 320.

The second conductive layer 180 may be etched using the second photoresist pattern 320 as an etch mask to form the second electrode 180a. In an embodiment, the second conductive layer 180 may be etched by an isotropic etching such as a wet etching. In an exemplary embodiment, an undercut region UC under the second photoresist pattern 320 may be formed in the isotropic etching process such as the wet etching.

The second conductive layer 180 may be etched using the second photoresist pattern 320 as an etch mask to form the second electrode 180a. In the etching process, a portion, under the second photoresist pattern 320, of the second conductive layer 180 may be etched to form the undercut region UC having a predetermined width between an edge of the second photoresist pattern 320 and a sidewall of the second electrode 180a exposed by the undercut region UC. The second conductive layer 180 may be etched such that the sidewall of the second electrode 180a may be recessed from the edge of the second photoresist pattern 320 by the predetermined width. A width of the second electrode 180a may be less than a width of the second photoresist pattern 320.

Figure 21:
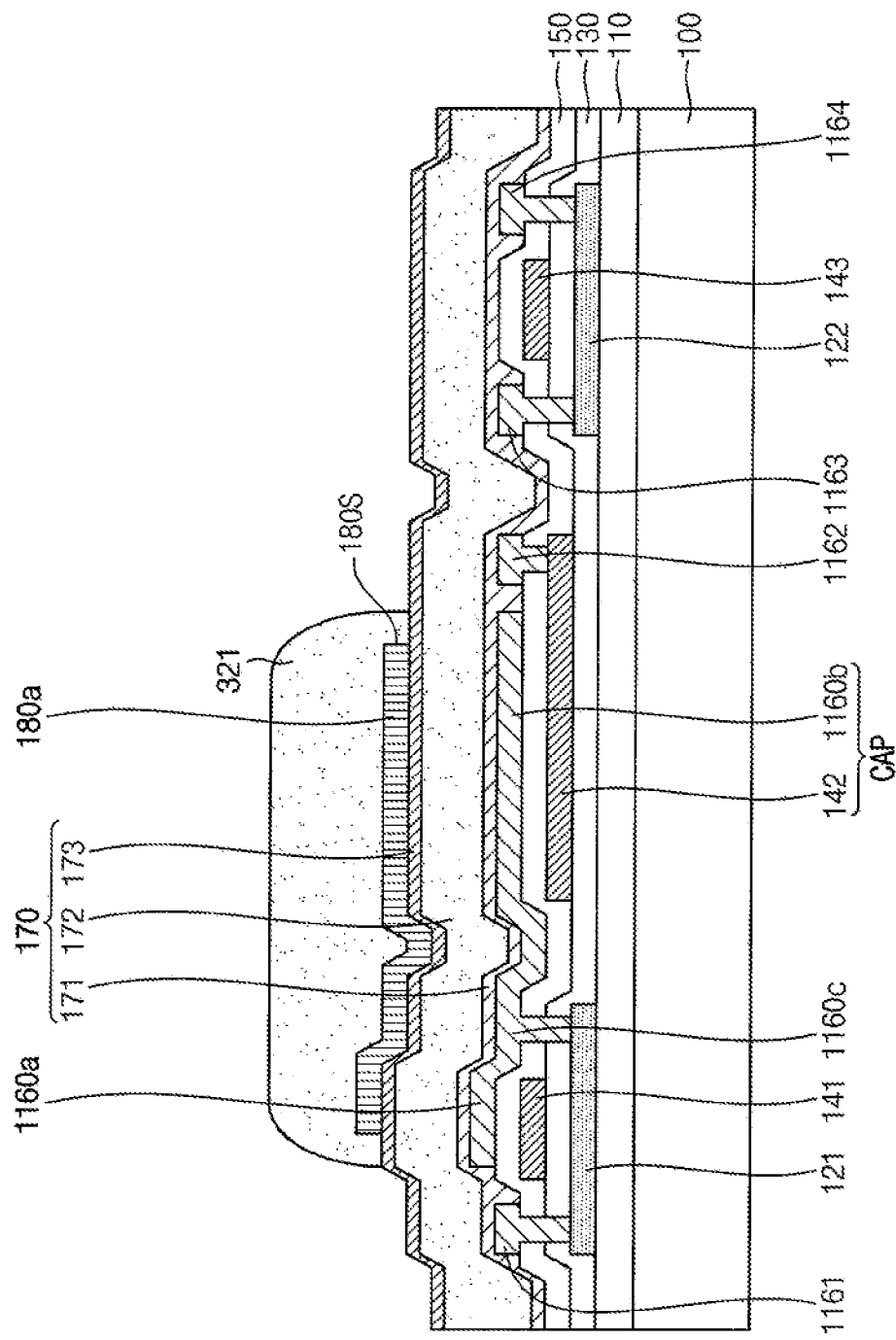

Referring to FIG. 21, in an embodiment, the second photoresist pattern 320 may be reflowed. For example, the reflowed second photoresist pattern 321 may cover a side portion 180S of the second electrode 180a, and the undercut region UC may be filled with the reflowed second photoresist pattern 321. However, the present invention is not limited thereto. In an exemplary embodiment, the second photoresist pattern 320 may not be reflowed.

Figure 22:
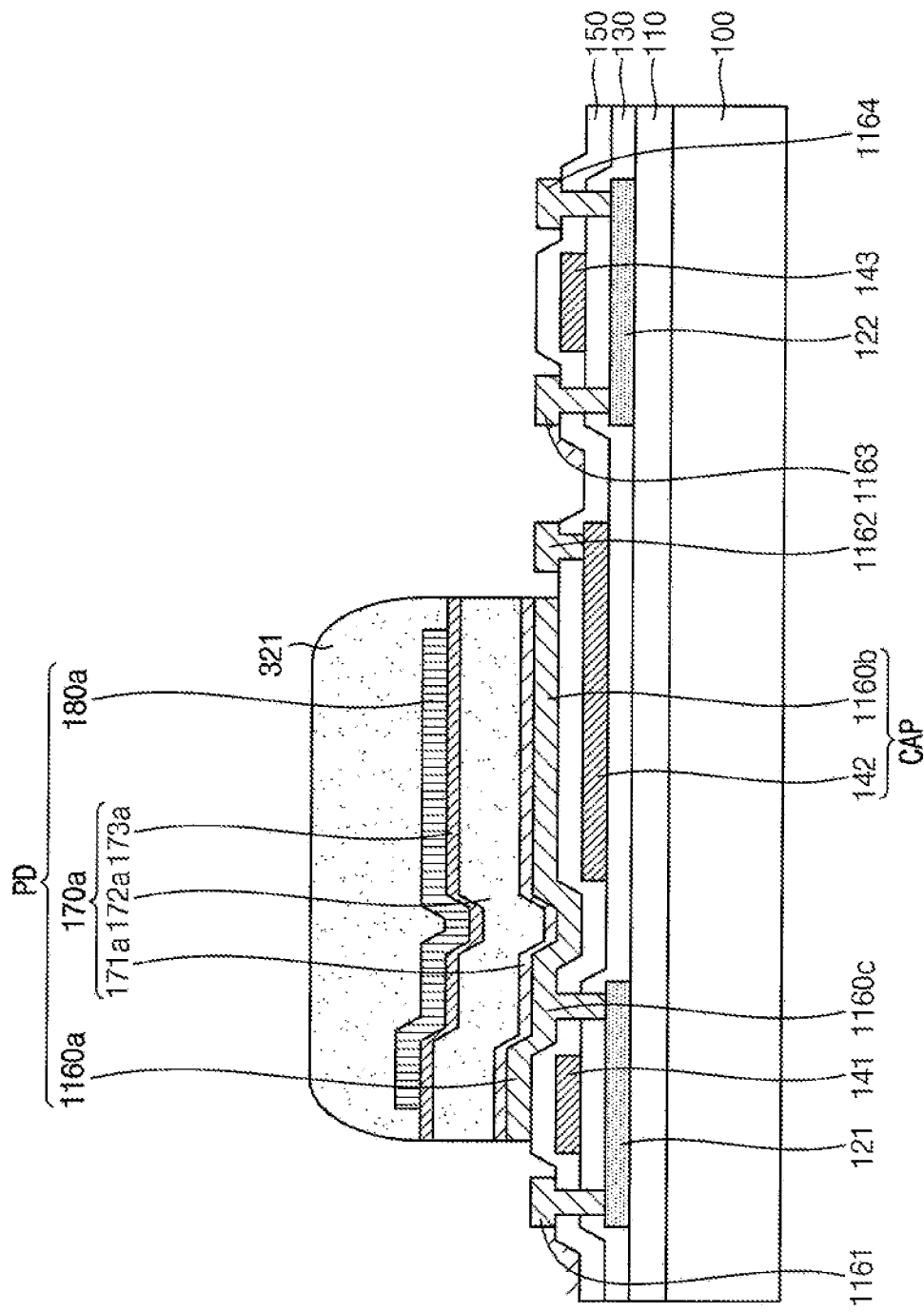

Referring to FIG. 22, the photoconductive layer 170 may be etched using the second photoresist pattern 321.

The photoconductive layer 170 may be etched using the second photoresist pattern 321 as an etch mask, so that the photoconductive pattern 170a may be formed. In an embodiment, the photoconductive layer 170 may be etched by an anisotropic etching process such as a dry etching.

The photoconductive layer 170 may be etched to an edge of the second photoresist pattern 321. For example, the shape, in a top down view, of the second photoresist pattern 321 may be transferred to the photoconductive layer 170 to form the photoconductive pattern 170*a*. Because the photoconductive layer 170 is etched to the edge of the second photoresist pattern 321, a width of the photoconductive pattern 170*a* may be greater than the width of the second electrode 180*a*. The first electrode 1160*a*, the photoconductive pattern 170*a*, and the second electrode 180*a* may form the photo diode PD.

Referring to FIG. 13, a third insulation layer 190 may be formed on the second electrode 180*a*, and the first drain electrode 1201, a second connection electrode 1202, the second source electrode 1203, and the second drain electrode 1204 may be formed on the third insulation layer 190. The first drain electrode 1201, the second connection electrode 1202, the second source electrode 1203, and the second drain electrode 1204 may contact the first drain connection electrode 1161, the first connection electrode 1162, the second source connection electrode 1163, and the second drain connection electrode 1164, respectively, through contact holes formed in the third insulation layer 190.

The first active layer 121, the first gate electrode 141, the first source electrode 1160*c*, the first drain connection electrode 1161, and the first drain electrode 1201 may form the first transistor TR1. In this case, the first source electrode 1160*c* and the first electrode 1160*a* may be integrally formed. The second active layer 122, the second gate electrode 143, the second source connection electrode 1163, the second source electrode 1203, the second drain connection electrode 1164, and the second drain electrode 1204 may form the second transistor TR2. The first connection electrode 1162 and the second connection electrode 1202 may electrically connect the second electrode 180*a* of the photo diode PD to the first capacitor electrode 142 of the capacitor CAP.

In the method of manufacturing the photo sensor according to an embodiment of the present invention, the first conductive layer 1160 may be etched by a first lithography process, and the second conductive layer 180 and the photoconductive layer 170 may be etched by a second photolithography process, so that the photo diode PD may be formed by performing a photolithography process twice. Accordingly, time and cost for manufacturing the photo sensor may be reduced.

The photo sensor according to the embodiments may be applied to a fingerprint recognition sensor of a display device included in a computer, a notebook, a mobile phone, a smartphone, a smart pad, a PMP, a PDA, an MP3 player, or the like.

Although the photo sensor and the method of manufacturing the photo sensor according to the embodiments have been described with reference to the drawings, the illustrated embodiments are examples, and may be modified and changed by a person having ordinary knowledge in the relevant technical field without departing from the technical spirit described in the following claims.

What is claimed is:

1. A method of manufacturing a photo sensor, the method comprising:

forming a first conductive layer on a substrate, the first conductive layer including a metal layer and a transparent conductive oxide layer formed on the metal layer;

forming, before the first conductive layer being patterned to a first electrode, a photoconductive layer on the first conductive layer;

forming a second conductive layer on the photoconductive layer;

forming a first photoresist pattern on the second conductive layer;

etching the second conductive layer using the first photoresist pattern as an etch mask to form a second electrode using an isotropic etching process;

deforming the first photoresist pattern to form a second photoresist pattern;

etching the photoconductive layer and the first conductive layer using the second photoresist pattern as an etch mask to form a photoconductive pattern and the first electrode, respectively; and heat-treating the first electrode after etching the photoconductive layer and the first conductive layer and after stripping the etched photoconductive layer.

2. The method of claim 1,
wherein the transparent conductive oxide layer is formed by a sputtering process.

3. The method of claim 1,
wherein resistivity of the transparent conductive oxide layer is greater than resistivity of the metal layer.

4. The method of claim 1,
wherein a thickness of the transparent conductive oxide layer is less than a thickness of the metal layer.

5. The method of claim 1,
wherein the photoconductive layer is formed by a chemical vapor deposition (CVD) process.

6. The method of claim 1,
wherein the photoconductive layer includes:
an N-type semiconductor layer;
an I-type semiconductor layer formed on the N-type semiconductor layer; and
a P-type semiconductor layer formed on the I-type semiconductor layer.

7. The method of claim 1,
wherein the second conductive layer includes a transparent conductive oxide.

8. The method of claim 1,
wherein the etching of the second conductive layer includes an isotropic etching process.

9. The method of claim 1,
wherein the etching of the second conductive layer to form a second electrode includes forming an undercut region under the first photoresist pattern, and
wherein a sidewall of the second electrode is recessed from an edge of the first photoresist pattern by a predetermined width.

10. The method of claim 9,
wherein the deforming of the first photoresist pattern includes:
performing a heat treatment on the first photoresist pattern to reflow the first photoresist pattern, thereby forming the second photoresist pattern,
wherein the second photoresist pattern fills the undercut region.

11. The method of claim 1,
wherein etching of the photoconductive layer and the first conductive layer includes an anisotropic etching process.

12. The method of claim 1,
wherein each of a width of the photoconductive pattern and a width of the first electrode is greater than a width of the second electrode.

13. A method of manufacturing a photo sensor, the method comprising:
forming a first conductive layer on a substrate;
forming a first photoresist pattern on the first conductive layer;
etching the first conductive layer using the first photoresist pattern to form a first electrode;
forming a photoconductive layer on the first electrode;
forming a second conductive layer on the photoconductive layer;
forming a second photoresist pattern on the second conductive layer;
etching the second conductive layer using the second photoresist pattern as an etch mask to form a second electrode;
deforming the second photoresist pattern to form a third photoresist pattern;
etching the photoconductive layer using the third photoresist pattern as an etch mask to form a photoconductive pattern; and
heat-treating the first electrode after etching the photoconductive layer and after stripping the etched photoconductive layer.

14. The method of claim 13,
wherein the first conductive layer includes metal.

15. The method of claim 13,
wherein the etching of the second conductive layer includes an isotropic etching process.

16. The method of claim 13,
wherein the etching of the second conductive layer to form the second electrode includes forming an undercut region under the second photoresist pattern, and
wherein a sidewall of the second electrode is recessed from an edge of the second photoresist pattern by a predetermined width.

17. The method of claim 16,
wherein the deforming of the second photoresist pattern to form the third photoresist pattern includes performing a heat treatment on the second photoresist pattern to reflow the second photoresist pattern, thereby forming the third photoresist pattern,
wherein the third photoresist pattern fills the undercut region.

18. The method of claim 13,
wherein the etching of the photoconductive layer includes an anisotropic etching process.

19. The method of claim 13,
wherein a width of the photoconductive pattern is greater than a width of the second electrode.

* * * * *